(12) United States Patent
Mastro et al.

(10) Patent No.: US 7,928,471 B2
(45) Date of Patent: Apr. 19, 2011

(54) GROUP III-NITRIDE GROWTH ON SILICON OR SILICON GERMANIUM SUBSTRATES AND METHOD AND DEVICES THEREFOR

(75) Inventors: Michael A. Mastro, Alexandria, VA (US); Charles R. Eddy, Jr., Columbia, MD (US); Shahzad Akbar, Colonial Heights, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 273 days.

(21) Appl. No.: 11/566,288

(22) Filed: Dec. 4, 2006

(65) Prior Publication Data

US 2008/0128745 A1    Jun. 5, 2008

(51) Int. Cl.
*H01L 31/102* (2006.01)
*H01L 33/00* (2010.01)
*H01S 5/00* (2006.01)

(52) U.S. Cl. ............. 257/184; 257/E33.049; 372/50.11
(58) Field of Classification Search .................. 257/184, 257/50.11, E33.049; 372/50.11
See application file for complete search history.

(56) References Cited

U.S. PATENT DOCUMENTS

| 6,617,060 | B2 |   | 9/2003  | Weeks, Jr. et al. |        |
|-----------|----|---|---------|--------------------|--------|
| 7,151,282 | B2 | * | 12/2006 | Lambkin et al.     | 257/79 |
| 7,332,365 | B2 | * | 2/2008  | Nakamura et al.    | 438/29 |
| 2003/0132433 | A1 | * | 7/2003 | Piner et al.      | 257/19 |
| 2004/0200406 | A1 |   | 10/2004 | Peczalski et al. |        |
| 2005/0067625 | A1 | * | 3/2005 | Hata              | 257/81 |
| 2005/0167709 | A1 | * | 8/2005 | Augusto           | 257/292 |
| 2005/0211988 | A1 | * | 9/2005 | Leycuras          | 257/77 |
| 2006/0091400 | A1 | * | 5/2006 | Faure et al.      | 257/76 |
| 2006/0175621 | A1 |   | 8/2006 | Ohtsuka et al.   |        |
| 2007/0091965 | A1 | * | 4/2007 | Tanabe et al.    | 372/50.124 |
| 2007/0128743 | A1 | * | 6/2007 | Huang et al.     | 438/21 |

OTHER PUBLICATIONS

Ishikawa, et al., "Improved Characteristics of GaN-based light-emitting diodes by distributed Bragg reflector grown on Si," Phys. Stat. Sol., vol. 201(12), pp. 2653-2657 (2004).
Nezu, "Shimei Semiconductor Develops Blue LED on Si Substrate at '1/2 Cost of Sapphire Product'," article published on Tech On website <http://techon.nikkeibp.co.jp/english/NEWS_EN/20061110/123411/> on Nov. 10, 2006, as downloaded on Feb. 9, 2007.

(Continued)

*Primary Examiner* — Phat X Cao
*Assistant Examiner* — Diana C Garrity
(74) *Attorney, Agent, or Firm* — Amy L Ressing; Joseph T. Grunkemeyer

(57) ABSTRACT

A structure including a $Si_{1-x}Ge_x$ substrate and a distributed Bragg reflector layer disposed directly onto the substrate. The distributed Bragg reflector layer includes a repeating pattern that includes at least one aluminum nitride layer and a second layer having the general formula $Al_yGa_{1-y}N$. Another aspect of the present invention is various devices including this structure. Another aspect of the present invention is directed to a method of forming such a structure comprising providing a $Si_{1-x}Ge_x$ substrate and depositing a distributed Bragg reflector layer directly onto the substrate. Another aspect of the present invention is directed to a photodetector or photovoltaic cell device, including a $Si_{1-x}Ge_x$ substrate device, a group III-nitride device and contacts to provide a conductive path for a current generated across at least one of the $Si_{1-x}Ge_x$ substrate device and the group III-nitride device upon incident light.

38 Claims, 11 Drawing Sheets

OTHER PUBLICATIONS

Nikkei Electronics Asia, "Blue First: High-Output LEDs on Si Substrate," article published on Tech On website <http://techon.nikkeibp.co.jp/article/HONSHI/20070126/126946/> in Feb. 2007, as downloaded on Feb. 9, 2007.

"Silicon Germanium (SiGe)—Thermal Properties," New Semiconductor Materials Archives of the the Ioffe Physico-Technical Institute, printed from NSM Archives of the Ioffe Physico-Technical Institute website <http://www.ioffe.ru/SVA/NSM/Semicond/SiGe/thermal.html> on Jan. 23, 2007.

Mastro, et al., "Wurtzite III-Nitride Distributed Bragg Reflectors on Si(100) Substrates," Japanese Journal of Applied Physics, vol. 45 (31), pp. L814-L816 (Aug. 4, 2006).

Mastro, et al., "Metal-organic chemical-vapor deposition of high-reflectance III-nitride distributed Bragg reflectors on Si substrates," J. Vac. Sci. Technol., vol. 24(4), pp. 1631-1634 (Jun. 23, 2006).

Mastro, et al., "Oxynitride mediated epitaxy of gallium nitride on silicon(1 1 1) substrates in a merged hydride/metal-organic vapor phase epitaxy system," Materials Science and Engineering B, vol. 127, pp. 91-97 (2006).

Dobrzanski, et al., "Ultraviolet detectors on gallium nitride," Elektronika, vol. 47(3), pp. 8-11 (2006) [with translated abstract].

Mastro et al., "High-reflectance III-nitride distributed Bragg reflectors grown on Si substrates," Appl. Phys. Lett., vol. 87, pp. 241103-1-3 (Dec. 5, 2005).

Usami, et al., "Floating zone growth of Si-rich SiGe bulk crystal using pre-synthesized SiGe feed rod with uniform composition," Journal of Crystal Growth, vol. 284(1-2), pp. 57-64 (Oct. 15, 2005).

Butte, et al., "Recent progress in the growth of highly reflective nitride-based distributed Bragg reflectors and their use in microcavities," Japanese Journal of Applied Physics, Part 1 (Regular Papers, Short Notes & Review Papers), vol. 44(10), pp. 7207-7216 (Oct. 2005).

Carlin, et al., "Progresses in III-nitride distributed Bragg reflectors and microcavities using AlInN/GaN materials," Physica Status Solidi B, vol. 242(11), pp. 2326-2344 (Sep. 2005).

Chang, et al., "Nitride-based light emitting diode and photodetector dual function devices with InGaN/GaN multiple quantum well structures," Solid-State Electronics, vol. 49(8) p. 1347-1351 (Aug. 2005).

Eddy, et al., "Investigation of Three-Step Epilayer Growth Approach of GaN Films to Minimize Compensation," J. of Electronic Materials, vol. 34(9), pp. 11871192 (2005).

Joblot, et al., "Growth of wurtzite-GaN on silicon (100) substrate by molecular beam epitaxy," Phys. Stat. Sol., vol. 2(7), pp. 2187-2190 (2005).

Schneider, et al., "Dual-Band QWIP Focal Plane Array for the Second and Third Atmospheric Windows," presented at International Workshop on Quantum Well Infrared Photodetectors (QWIP2004), Kananaskis, Canada, (Aug. 9-13, 2004).

Zhang, et al., "Bulk single crystal growth of silicon-germanium (English Abstract)," Guti Dianzixue Yanjiu Yu Jinzhan/Research and Progress of Solid State Electronics, vol. 24(2), p. 253-257 (May 2004), printed from wangfangdata website <http://www.wanfangdata.com.cn/qikan/periodical.Articles/gtdzxyjyjz/gtdz2004/0402/040223.htm> on Jan. 23, 2007.

Li, et al., "Picosecond response of gallium-nitride metal-semiconductor-metal photodetectors," Applied Physics Letters, vol. 84(12), pp. 2091-2093 (Mar. 22, 2004).

Yao, et al., "MOCVD growth of AlN/GaN DBR structures under various ambient conditions," Journal of Crystal Growth, vol. 262(1-4), pp. 151-156 (Feb. 15, 2004).

Mishra, et al., "Gallium nitride electronics: Watt is the limit? [summary of GaN semiconductor devices]," IEEE Device Research Conference, vol. 1(1), pp. 3-5 (2004).

Posthuma, "Development of low cost germanium photovoltaic cells for application in TPV using spin on diffusants," AIP Conference Proceedings, No. 738, pp. 337-344 (2004).

Eddy, et al., "Investigation of Three-Step Epilayer Growth Approach of GaN Thin Films to Minimize Compensation (Abstract)," 2003 International Symposium on Compound Semiconductors, pp. 33-34 (Aug. 25-27, 2003).

Dadgar, et al., "Metalorganic chemical vapor phase epitaxy of gallium-nitride on silicon," Phys. Stat. Sol., No. 6, pp. 1583-1606 (Aug. 12, 2003).

Xuegong, et al., "Intrinsic gettering in germanium-doped Czochralski crystal silicon crystals," Journal of Crystal Growth, vol. 250(3-4), pp. 359-363 (Apr. 1, 2003).

Dadgar, et al. "MOVPE growth of GaN on Si(1 1 1) substrates," Journal of Crystal Growth, vol. 248, pp. 556-562 (2003).

Dikme, et al., "Investigation of buffer growth temperatures for MOVPE of GaN on Si(1 1 1)," Journal of Crystal Growth, vol. 248, pp. 578-582 (2003).

Gong, "Growth and characterization of GaN and AlN films on (1 1 1) and (0 0 1) Si substrates," Journal of Crystal Growth, vol. 247, pp. 261-268 (2003).

Rajagopal, et al., "Large-Area, Device Quality GaN on Si Using a Novel Transition Layer Scheme," Mat. Res. Soc. Symp. Proc.,vol. 743, pp. L1.2.1-6 (2003).

Reiher, et al., "Efficient stress relief in GaN heteroepitaxy on Si(1 1 1) using low-temperature AlN interlayers," Journal of Crystal Growth, vol. 248, pp. 563-567 (2003).

Stonas, et al., "Development of gallium nitride-based MEMS structures," Transducers '03—12th International Conference on Solid-State Sensors, Actuators and Microsystems, Digest of Technical Papers, vol. 2(2), pp. 1156-1159 (2003).

Jang, et al., "Characteristics of GaN/Si(1 1 1) epitaxy grown using Al0.1Ga0.9N/AlN composite nucleation layers having different thicknesses of AlN," Journal of Crystal Growth, vol. 241, pp. 289-296 (2002).

Klausing, et al., "Electron beam pumped nitride vertical cavity surface emitting structures with AlGaN/AlN DBR mirrors," Physica Status Solidi C, No. 1, pp. 428-432 (2002).

Lee, et al., "Effect of buffer layer on the growth of GaN on Si substrate," Journal of Crystal Growth, vol. 237-239, pp. 1094-1098 (2002).

Shealy, et al., "Gallium nitride (GaN) HEMT's: progress and potential for commercial applications," 2002 GaAs IC Symposium, IEEE Gallium Arsenide Integrate Circuit Symposium. 24th Annual Technical Digest, pp. 243-246 (2002).

Weeks, et al., "Silicon Substrates Provide a Disruptive Technology for GaN". Compound Semiconductor, vol. 7, pp. 63—(Nov. 2001), as printed from Compound Semiconductor website <http://compoundsemiconductor.net/articles/magazine/7/11/5/1> on Jan. 23, 2007.

Hazra, et al., "Role of deposition parameters on the photovoltaic quality of amorphous silicon germanium alloys: correlation of microstructure with defect density and electronic transport," Journal of Physics D (Applied Physics), vol. 34(16), pp. 2475-2481 (Aug. 21, 2001).

Whitake, "Nitronex Grows GaN HEMTs on 4-Inch Silicon Wafers (Nitride News)," Compound Semiconductor (Mar. 2001), as printed from Compound Semiconductor website <http://compoundsemiconductor.net/articles/magazine/7/3/40/1> on Dec. 4, 2006.

Semond, et al., "Growth by Molecular Beam Epitaxy and Optical Properties of a Ten-Period AlGaN/AlN Distributed Bragg Reflector on (111)Si," Phys. Stat. Sol., vol. 183, pp. 163-167 (2001).

Deitch, et al., "Bulk Single Crystal Growth of Silicon-Germanium," J. Electronics Materials, vol. 29(9), pp. 1074-1078 (Sep. 2000).

Deng, et al., "Amorphous silicon and silicon germanium materials for high-efficiency triple-junction solar cells," Solar Energy Materials and Solar Cells, vol. 62(1-2), pp. 89-95 (Apr. 2000).

Larason, et al., "Spatial uniformity of responsivity for silicon, gallium nitride, germanium, and indium gallium arsenide photodiodes," Metrologia, vol. 35(4), pp. 491-496 (1998).

Bliss, et al., "Silicon-germanium bulk alloy growth by liquid encapsulated zone melting," Journal of Crystal Growth, vol. 174(1), pp. 187-193 (Apr. 1997).

Qian, et al., "Structural Defects and Their Relationship to Nucleation of GaN Thin Films," Mat. Res. Soc. Symp. Proc., vol. 423, pp. 475-486 (1996).

Murtaza, et al., "High-efficiency, dual-wavelength, wafer-fused resonant-cavity photodetector operating at long wavelengths," IEEE Photonics Technology Letters, vol. 7(6), pp. 679-681 (Jun. 1995).

Srinivasan, et al., "High quantum efficiency dual wavelength resonant-cavity photodetector," Applied Physics Letters, vol. 66(5), pp. 535-537 (Jan. 30, 1995).

Schliz, et al., "Bulk growth of silicon-germanium solid solutions," Journal of Material Science: Materials in Electronics, vol. 6, pp. 265-279 (1995).

Murtaza, et al., "High-reflectivity GeSi/Si asymmetric Bragg reflector at 0.8 μm," Electronics Letters, vol. 30(4), pp. 315-316 (Feb. 17, 1994).

Borne, et al., "Efficiency improvements of silicon solar cells by absorption enhancement with germanium," 1994 IEEE First World Conference on Photovoltiac Energy Conversion, Conference Record of the IEEE Photovoltaic Specialists Conference, vol. 2, pp. 1637-1639 (1994).

Derhacobian, et al., "Determination of surface recombination velocity and bulk lifetime in detector grade silicon and germanium crystals," 1993 IEEE Conference Record, Nuclear Science Symposium and Medical Imaging Conference, vol. 1(1), pp. 406-410 (1993).

Lowe, et al., "Real-Time X-Ray Diffraction Observation of a Pin-Slip Mechanism in GexSi1-x Strained Layers," Phys. Rev. Lett., vol. 67(18), pp. 2513-2516 (Oct. 28, 1991).

Tokuda, et al., "Dual-wavelength multiple quantum well n-i-p-i-n photodetector using an optically bistable abrupt absorption edge," Applied Physics Letters, vol. 56(3), pp. 227-229 (Jan. 15, 1990).

Chang, et al., "High-performance monolithic dual-MSM photodetector for long-wavelength coherent receivers," Electronics Letters, vol. 25(16), p. 1021-1023 (Aug. 3, 1989).

Lee, et al., "An AlGaAs—GaAs dual-wavelength photodetector with 500 Å resolution," Solid-State Electronics, vol. 27(10), pp. 917-919 (Oct. 1984).

Boiko, et al., "Transverse photovoltaic effects in germanium and silicon subjected to laser radiation pulses," Soviet Physics—Semiconductors, vol. 16 (10), pp. 1156-1160 (Oct. 1982).

De Kock, et al., "Crystal growth of bulk crystals: purification, doping and defects," Handbook on semiconductors. vol. 3. Materials, properties and preparation, pp. 247-333 (1980).

* cited by examiner

GROUP III-NITRIDE GROWTH ON SILICON OR SILICON GERMANIUM SUBSTRATES AND METHOD AND DEVICES THEREFOR

FIELD OF THE INVENTION

The present invention is generally directed to a group III-nitride structure grown on silicon or silicon germanium alloy substrates, devices having this structure and the manufacture thereof.

BACKGROUND OF THE INVENTION

The group III-nitride family of materials can be fabricated into optoelectronic devices that emit or absorb light in the ultraviolet (UV) and the entire visual spectrum. There is a large commercial market for, for example, GaN-based light emitting diodes (LEDs) and edge-emitting lasers that emit light in the UV, blue and green wavelength ranges. In the future it is expected that a number of additional devices, including vertical cavity surface emitting lasers (VCSELs) and resonant cavity light emitting diodes (RCLEDs) will be commercialized based on the group III-nitride material.

Deposition of group III-nitride films is typically conducted on expensive silicon carbide (SiC) or sapphire, i.e., aluminum oxide, substrates. SiC and sapphire substrates represent a significant portion of the overall cost to fabricate a LED. Group III-nitride-based electronic devices are typically fabricated on SiC substrates due to the high thermal conductivity of SiC. Unfortunately, SiC is not available in large diameters and is exceedingly expensive particularly for high-purity, insulating SiC, which is the preferred substrate for a group III-nitride high electron mobility transistors (HEMTs).

Epitaxy of high-quality group III-nitride films on silicon (Si), rather than SiC, is difficult due to the large lattice and thermal expansion coefficient mismatch between the group III-nitride film and the Si substrate. For example, volume production of GaN LEDs deposited on Si substrates is generally plagued with high defect and crack density in group III-nitride films because of the large lattice and thermal expansion mismatch with the Si substrate.

Conventionally, GaN-based structures have been grown on Si by first depositing a buffer layer on the Si substrate such as a thick AlN layer of about 25 to 300 nm, ZnO, TiN, SiC, and others. Using such a buffer layer, a superlattice (SL), which for example may be a distributed Bragg reflector (DBR), which is designed to reduce the defect density of a GaN layer has been placed away from the substrate, for example either on a buffer layer or on a GaN/buffer layer. However, the addition of such a SL or buffer layer, while allowing for a crack free and reduced defect GaN layer, causes distorted reflectance because of the buffer layers presence and thus is not particularly well suited for optoelectric applications such as an LED.

BRIEF SUMMARY OF THE INVENTION

One aspect of the present invention is generally directed to a structure including a $Si_{1-x}Ge_x$ substrate, wherein $0 \leq x < 1$, and a distributed Bragg reflector layer disposed directly onto the substrate. The distributed Bragg reflector layer includes a repeating pattern that includes at least one aluminum nitride layer and a second layer having the general formula $Al_yGa_{1-y}N$, wherein $0 \leq y < 1$.

Another aspect of the present invention is directed to a method of forming such a structure comprising providing a $Si_{1-x}Ge_x$ substrate, wherein $0 \leq x < 1$, and depositing a distributed Bragg reflector layer directly onto the substrate. Depositing the distributed Bragg reflector layer includes depositing at least one aluminum nitride layer onto the substrate and depositing a second layer having the general formula $Al_yGa_{1-y}N$, wherein $0 \leq y < 1$. Depositing at least one aluminum nitride layer and depositing a second layer having the general formula $Al_yGa_{1-y}N$ are repeated to form the distributed Bragg reflector layer.

Another aspect of the present invention is directed to a photovoltaic or photodetector cell device, including a $Si_{1-x}Ge_x$ substrate device, a group III-nitride device and contacts. The $Si_{1-x}Ge_x$ substrate device includes a $Si_{1-x}Ge_x$ substrate, wherein $0 \leq x < 1$. The $Si_{1-x}Ge_x$ substrate is doped to form a p/n or p/i/n junction. The group III-nitride device is deposited onto the $Si_{1-x}Ge_x$ substrate and also has a p/n or p/i/n junction. The contacts provide a conductive path for a current generated across at least one of the $Si_{1-x}Ge_x$ substrate device and the group III-nitride device upon incident light (for example, to detect a current across each of the $Si_{1-x}Ge_x$ substrate device and the group III-nitride device individually for a dual-junction photodetector and/or to collect a current across both the $Si_{1-x}Ge_x$ substrate device and the group III-nitride device for a dual-junction photovoltaic cell).

The foregoing and other features and advantages of the present invention will be apparent from the following, more particular description of a preferred embodiment of the invention, as illustrated in the accompanying drawings.

DETAILED DESCRIPTION OF THE INVENTION

Figure 1:
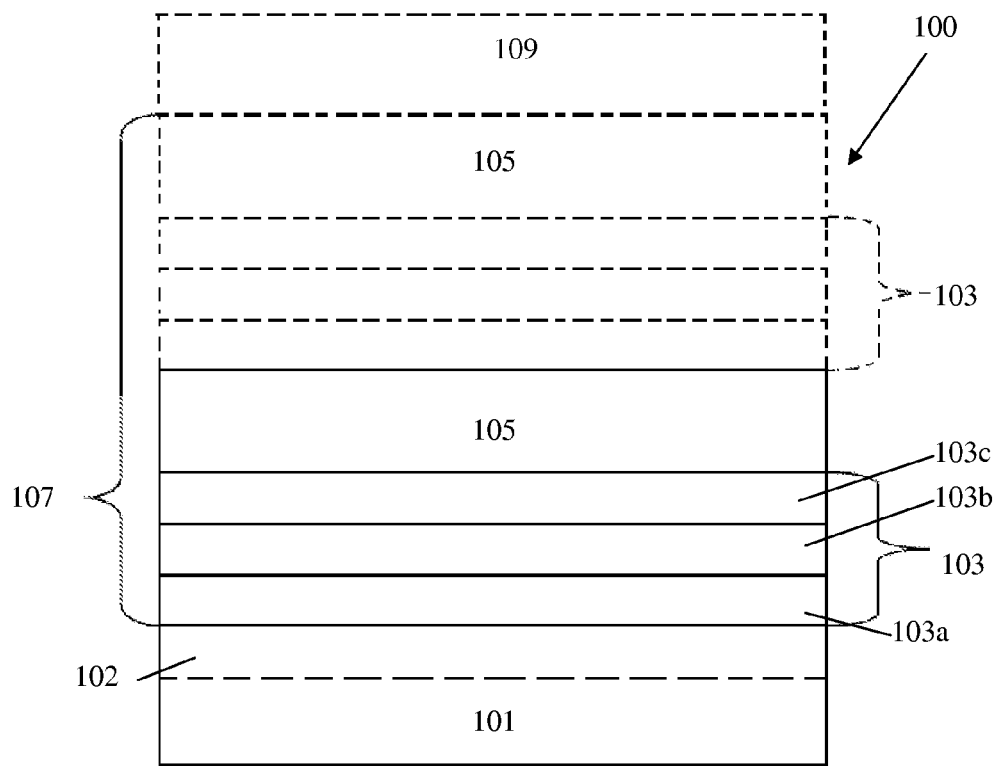
FIG. 1 is a schematic representation of an embodiment of a general structure of the present invention.

Preferred embodiments of the present invention are now described with reference to the Figures, in which like reference numerals are generally used to indicate identical or functionally similar elements. Also in the Figures, the left most digit of each reference numeral generally corresponds to the Figure in which the reference numeral appears. While specific details of the preferred embodiments are discussed, it should be understood that this is done for illustrative purposes only. A person skilled in the relevant art will recognize that other configurations and arrangements can be used without departing from the spirit and scope of the invention. It will also be apparent to a person skilled in the relevant art that this invention can also be employed in other applications.

The present invention includes a structure in which a SiC or sapphire substrate has been substituted with a silicon (Si) substrate or a Si and germanium (Ge) alloy substrate. Specifically, the present invention includes a structure deposited directly onto a substrate having the general formula $Si_{1-x}Ge_x$, where x is the ratio of Ge alloyed with Si. Where x is zero, the substrate is a high purity Si substrate with no Ge alloyed therein. A Si substrate, which, on a per square inch basis, has at most one-tenth the cost of sapphire and one-hundredth the cost of SiC. Further, while Si is cheaper and more readily available for use as a substrate, alloying Ge with Si adds little increase in cost when compared to SiC or sapphire substrates. Large size (2 to 12 inch diameter) and high quality Si substrates are readily available due to the maturity of the silicon industry. In the present invention, a DBR layer is fabricated directly on the Si or SiGe substrate, without an insulating buffer layer. Alternatively, a DBR layer may be fabricated on a Si substrate incorporating a SiGe epilayer deposited thereon, which is cheaper and more readily available than alloyed SiGe substrates themselves.

By placing the DBR layer directly on a Si or SiGe substrate without a distorting insulating buffer layer, the reflectance of the structure is enhanced due to the high index of reflection contrast between the DRB layer and the generally opaque $Si_{1-x}Ge_x$ substrate, providing for a high reflectance, for example greater than about 90% and as high as about 96.8% on Si (111) and greater than about 69.8% on Si (100). In fact, prior to the present invention, the highest reflectance known to the inventors on a Si (111) substrate was 78%. F. Semond, et al., *Phys. Status Solidi A*, Vol. 183, page 163 (2001). However, using known methods reported therein, a reflectance greater than 78% would not have been possible on a Si (111) substrate. For example, to reach a reflectance of 97% using the reported known methods, a DBR layer would have to have to be at least double the thickness, which would be too thick to be sustainable on a Si substrate due to the high strain and would suffer from excessive cracking. A structure of the present invention, however, can achieve a very high reflectance (greater than 78% and even greater than 90%) using a significantly thinner structure, thereby substantially reducing the strain and potential for cracking. A SiGe epilayer incorporated into a Si substrate is non-distorting, unlike conventional insulating buffer layers.

There is limited efficiency in optoelectronic devices made from group III-nitride films due to optical absorption of UV, visible and IR wavelengths in the $Si_{1-x}Ge_x$ substrate. However, inserting a DBR layer between an active layer of an LED device and the $Si_{1-x}Ge_x$ substrate causes the emitted light to be reflected away from the $Si_{1-x}Ge_x$ substrate thus approximately doubling the efficiency of the device.

The DBR layer of the present invention also provides the benefits of strain compensation between the $Si_{1-x}Ge_x$ substrate and group III-nitride layers of a particular device that is deposited on the structure. The DBR layer of the present invention absorbs the strain between the group III-nitride layer and the $Si_{1-x}Ge_x$ substrate. Further, Ge has a thermal expansion coefficient of $5.9 \times 10^{-6}$ $K^{-1}$ at 300K, which is closer to that of, for example GaN at 300K, which is $5.59 \times 10^{-6}$ $K^{-1}$, than Si, which is $2.6 \times 10^{-6}$ $K^{-1}$. Thus, increasing the concentration of Ge, x, in the substrate further reduces a mismatch in thermal expansion coefficient between the $Si_{1-x}Ge_x$ substrate and group III-nitride layers, which reduces dislocations and cracking.

The DBR layer filters dislocations, such that a group III-nitride layer can be deposited with a significant reduction in dislocations over a group III-nitride layer placed directly on a $Si_{1-x}Ge_x$ substrate. Such dislocations that would otherwise propagate from the substrate interface can be deleterious to device performance. Additionally, without the use of an insulating buffer layer on the $Si_{1-x}Ge_x$ substrate, vertical devices may be developed on highly conductive $Si_{1-x}Ge_x$ substrates similar to the GaN LEDs currently being produced on conductive SiC substrates.

The previously described cost and size advantages for $Si_{1-x}Ge_x$ make $Si_{1-x}Ge_x$ also attractive as a substrate for group III-nitride electronic devices. However, the narrow band gap of the $Si_{1-x}Ge_x$ substrate limits the resistivity of the substrate. Nonetheless, a high power group III-nitride device may be built on a $Si_{1-x}Ge_x$ substrate, if the device is sufficiently isolated from the active region. For example, direct growth of a thick, insulating AlN buffer layer on a $Si_{1-x}Ge_x$ substrate can be used to decrease microwave loss to the substrate, improving both small- and large-signal gain as well as increasing the breakdown voltage of a device built in a group III-nitride layer grown on the thick AlN layer. However, a sufficiently thick AlN layer, which would have to be grown thicker than approximately 300 nm, is prone to cracks due to the large tensile strain developed during growth and cool down from growth temperature. Instead, the DBR layer of the present invention deposited directly onto a $Si_{1-x}Ge_x$ substrate provides for increased resistivity and reduction in breakdown voltage without the need for a thick insulating layer and without being prone to cracking.

General Structure of the Present Invention

FIG. 1 illustrates a general structure 100 of the present invention. Structure 100 includes a $Si_{1-x}Ge_x$ (111) or $Si_{1-x}Ge_x$ (100) substrate 101, which may incorporate a $Si_{1-x}Ge_x$ epilayer 102. A DBR layer 107 is deposited onto the substrate 101. The DBR layer 107 includes a deposited doped or undoped AlN layer 103, or more than one AlN layer 103, followed by a doped or undoped $Al_yGa_{1-y}N$ layer 105 deposited over the AlN layer 103. The ratio of AlN content, y, of $Al_yGa_{1-y}N$ layer 105 may be varied depending upon the application. For example, y may be equal to 0 (which is pure GaN) to about 0.1 for a visible spectrum DBR layer 107, y may be equal to about 0.1 to about 0.3 for a UV spectrum DBR layer 107, and y may be greater than about 0.3 for an insulating DBR layer 107. AlN layer 103, for example, may be doped when the application includes vertical conduction. The DBR layer 107 preferably includes the repeated deposition of AlN layer 103 and Al$_y$Ga$_{1-y}$N layer 105, for example, repeated two to nine times. All of the repeated AlN and Al$_y$Ga$_{1-y}$N layers 103/105 form the single DBR layer 107 of the present invention. Repeating AlN layer 103 and Al$_y$Ga$_{1-y}$N layer 105 increases reflectance, changes resistance and reduces dislocations. Thus, these layers may be repeated in the DBR layer 107 as often as needed until a desired reflectance, resistance or dislocation reduction is achieved.

Next, an optional group III-nitride cap layer 109 may be deposited over DBR layer 107. An optional optoelectronic or electronic device may include structure 100 and may, for example, include optional group III-nitride cap layer 109, as discussed in further detail below.

Figure 2A:
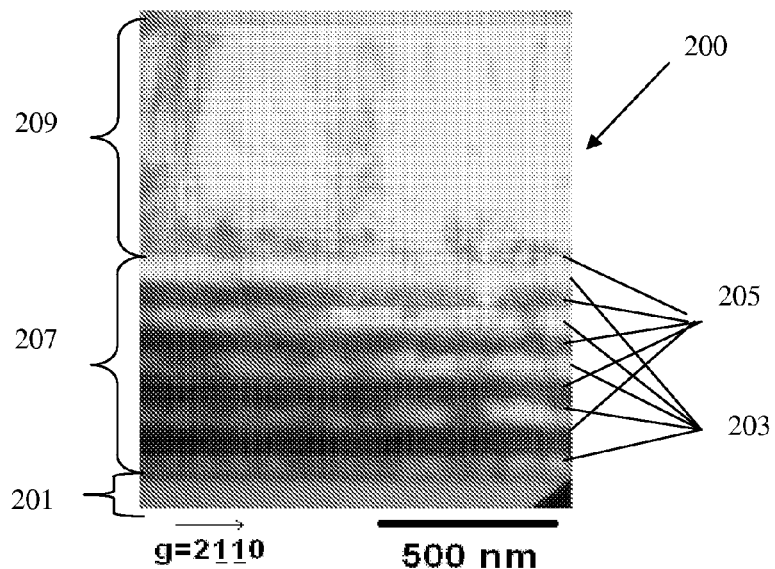
FIG. 2A is a transmission electron micrograph (TEM) of an embodiment of a structure of the present invention on a Si (100) substrate.

The alternating and repeating sequence of AlN layer 103 and Al$_y$Ga$_{1-y}$N layer 105 in the DBR layer 107 acts to filter dislocations originating from the substrate interface. FIG. 2A is a transmission electron micrograph (TEM) of a structure 200, which is an example of a structure of the present invention. In the example of FIG. 2A, structure 200 includes a Si (100) substrate 201, a DBR layer 207 including AlN/Al$_y$Ga$_{1-y}$N layers 203/205, where y is about 0.05, repeated five times and a 700 nm GaN cap layer 209.

The TEM of FIG. 2A demonstrates an extremely high amount of dislocations, appearing as the darker regions, in the first AlN layer 203 at the Si/AlN interface (e.g., greater than about $10^{12}$ dislocations/cm$^2$). The alternating layers of the DBR layer 207 filtered the dislocations via dislocation termination at each AlN 203/Al$_y$Ga$_{1-y}$N 205 interface. The number of dislocations (relative dark regions) in the later deposited AlN layers 203 is observed to drop by more than two orders of magnitude through the DBR layer 207.

Figure 2B:
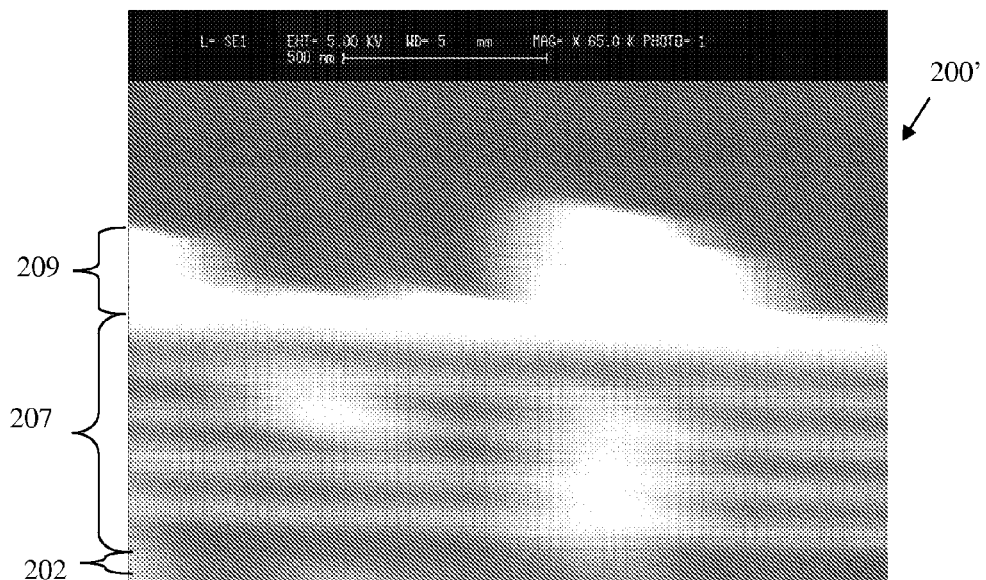
FIG. 2B is a scanning electron micrograph (SEM) of an embodiment of a structure of the present invention on a SiGe substrate.

Alloying Ge into the Si substrate would have reduced the dislocations in the first AlN layer 203 at the Si substrate/AlN interface, due to the reduced thermal expansion mismatch between the Si$_{1-x}$Ge$_x$ substrate and the GaN cap layer 209. FIG. 2B is a scanning electron micrograph (SEM) of a structure 200', which is an example of a structure of the present invention. In the example of FIG. 2B, structure 200' includes a Si$_{1-x}$Ge$_x$ (100) substrate 202, where x is about 0.04, a DBR layer 207 including AlN/Al$_y$Ga$_{1-y}$N layers, where y is about 0.05, repeated five times and a 300 nm thick GaN cap layer 209. Although the SEM of FIG. 2B is not as clear as the TEM of FIG. 2A, the repeating pattern of the DBR layer 207 is clearly visible in FIG. 2B.

Preferably, the various layers of structure 100 of FIG. 1 may be deposited by metalorganic chemical vapor deposition (MOCVD), although the layers of structure 100 may alternatively be created by molecular beam epitaxy (MBE), hydride vapor phase epitaxy (HVPE), pulsed laser deposition (PLD), atomic layer deposition (ALD) and other deposition methods that would be apparent to one of ordinary skill in the art.

In one embodiment of the present invention, Si$_{1-x}$Ge$_x$ substrate 101 may be, for example, a commercial Si (111) or Si (100) wafer. In one embodiment, a Si (100) substrate (i.e., x equals zero) may be off-cut by 4 to 5 degrees towards the (110) direction to introduce an asymmetric constraint that may enhance deposition of single-crystal wurtzite group III-nitride, with a six-fold symmetry. In other words, cutting the wafer at a 4 to 5 degree angle discourages the formation of misoriented grains, thus improving group III-nitride growth. Similarly, the preferred embodiment of a Si$_{1-x}$Ge$_x$ (100) substrate is to off-cut the wafer by 4 to 5 degrees towards the (110) direction.

Figure 3A:
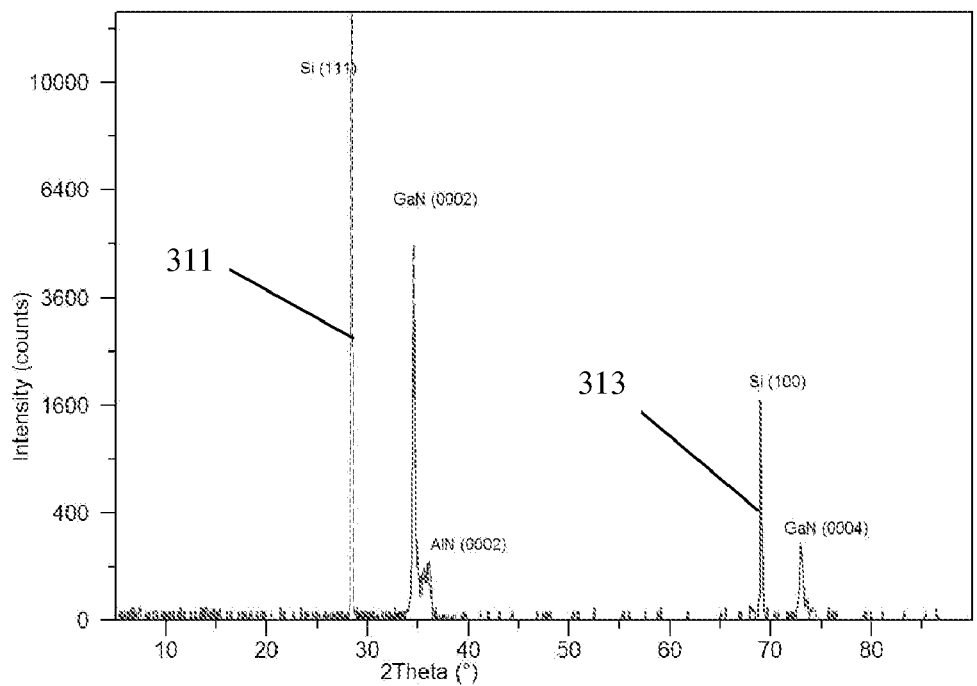
FIG. 3A is a graphical representation of x-ray diffraction data performed on two example structures of the present invention made on Si (100) and Si (111) substrates, respectively.
Figure 3B:
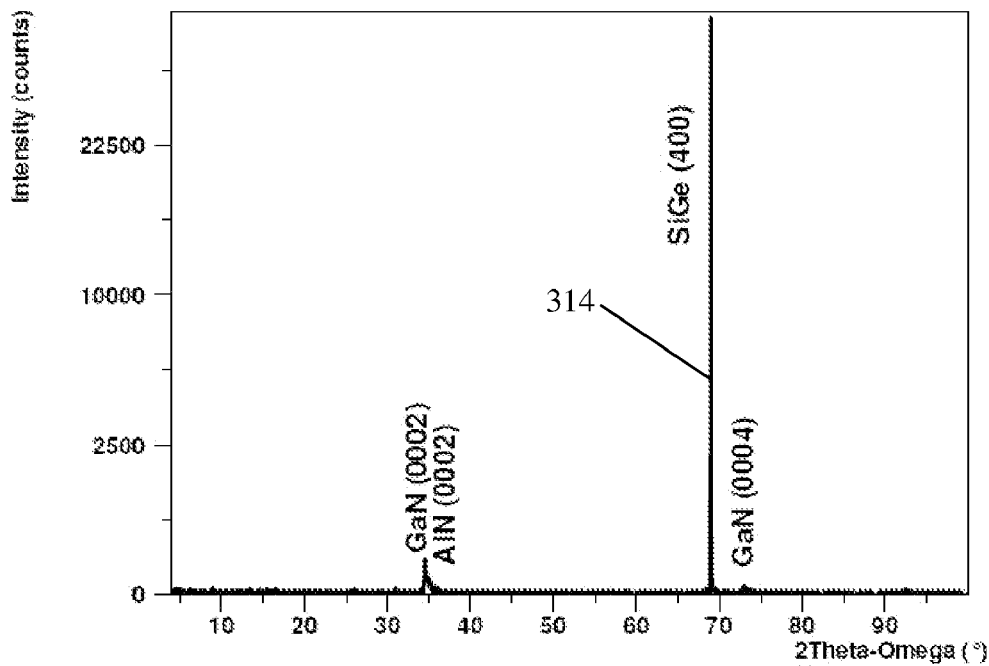
FIG. 3B is a graphical representation of x-ray diffraction data performed on an example structure of the present invention made on a SiGe substrate.

FIG. 3A is a graphical representation of x-ray diffraction data performed on two example structures of the present invention. Curve 311 shows a ω-2θ scan of a Si (111) substrate (i.e., x equals zero) structure having a DBR layer including AlN/Al$_{0.05}$Ga$_{0.95}$N layers repeated seven times and a 500 nm GaN cap layer. Meanwhile, curve 313 shows a ω-2θ scan of a Si (100) (i.e., x equals zero) substrate structure off-cut by 4 to 5 degrees towards the (100) direction having the same DBR layer components as the prior example structure, but only repeated five times, and a 500 nm GaN cap layer. Comparing the two curves 311/313 illustrates that substantial GaN growth, demonstrated at about 34 degrees, is achievable on both Si (100) and Si (111) substrates. FIG. 3B is a graphical representation of x-ray diffraction data performed on another example structure of the present invention. Curve 314 shows a ω-2θ scan of a SiGe (100) substrate (i.e., x is greater than zero) structure having a DBR layer including AlN/Al$_{0.05}$Ga$_{0.95}$N layers repeated five times and a 300 nm GaN cap layer. Curve 314 demonstrates that hexagonal crystal GaN, demonstrated at 34 degrees, may be successfully grown on a SiGe substrate.

General Manufacturing Method of the Present Invention

To form the general structure 100 of FIG. 1, Si$_{1-x}$Ge$_x$ substrate 101, which may incorporate a SiGe epilayer 102, first may be cleaned using an RCA-1 cleaning process. Then, the substrate 101 may be inserted into a MOCVD reactor, for example, where it is first baked in hydrogen at about 1000° C. Then, triethylaluminum (TEA), ammonia, and hydrogen are used to deposit a first AlN layer 103. Growth of the first AlN layer 103 may be started by exposing the substrate 101 to a flow of TEA for a period of 15-20 seconds. Then, a flow of ammonia is initiated that commences the growth of AlN layer 103 on the substrate 101. Deposition of the first AlN layer 103 is performed at a relatively high temperature of between about 950-1150° C., preferably about 975° C.

To control the stress distribution, the AlN layer 103 may be partially or completely grown at a lower temperature. For example, the first AlN layer 103 may be deposited as discussed above, which is referred to herein as a high temperature AlN sub-layer 103a, as illustrated in FIG. 1. At a desired thickness of the high temperature AlN sub-layer 103a, growth is halted by turning off the TEA. The structure is then ramped to a lower temperature, for example about 600-800° C., under the presence of flowing ammonia to avoid decomposition and roughening of the high temperature AlN sub-layer 103a.

At the relatively lower temperature, the TEA is turned back on and a thin, for example about 1-66 nm, low temperature AlN sub-layer 103b is deposited. The low temperature AlN sub-layer 103b helps improve crystallinity and relieve the strain in the AlN layer 103 that results from the lattice and thermal coefficient of expansion mismatches with the Si$_{1-x}$Ge$_x$ substrate 101.

After the low temperature AlN sub-layer 103b is deposited, the TEA is turned off and the structure is again heated to a higher temperature, for example, about 1000-1075° C., where, if necessary, the remainder of the AlN layer 103 is deposited as a second high temperature AlN sub-layer 103c. The thickness of this second high temperature AlN sub-layer 103c may be, for example about 0 to about 66 nm. Ammonia flow may be applied to maintain the stability of the group III-nitride layers and the flow dynamics in the reactor.

Growth of a first Al$_y$Ga$_{1-y}$N layer 105, in this case in which y equals zero (i.e., GaN), is started by flowing trimethylgallium (TMG) and ammonia, which is applied to maintain stability of the group III-nitride layer. Deposition of the GaN layer 105 also may be performed at a relatively high temperature of about 950 to about 1150° C., preferably about 1000° C. At the desired thickness of the GaN layer 105, growth is halted by turning off the TMG.

For an $Al_yGa_{1-y}N$ layer 105 in which y is greater than zero, the process is similar to that described above except that TEA is flowed in addition to TMG and ammonia during formation of the $Al_yGa_{1-y}N$ layer 105. Using an increasing Al content, y, in $Al_yGa_{1-y}N$ layer 105 decreases the overall reflectance due to a decrease in index of refraction contrast between AlN layer 103 and $Al_yGa_{1-y}N$ layer 105. However, the loss in reflectivity is minimal particularly for low values of y, i.e., less than 0.2.

Another advantage of having an $Al_yGa_{1-y}N$ layer 105 is that the strain in the structure 100 can be adjusted by changing the Al content, y, in the $Al_yGa_{1-y}N$ layer 105. Preferably, the $Al_yGa_{1-y}N$ layer 105 contains less than approximately 5% Al (i.e., y=about 0.05). For UV wavelength applications, where the $Al_yGa_{1-y}N$ layer absorbs the emitted light, however, the Al content may be increased to about 50% (i.e., y=about 0.5). For electronic device applications, to insure the insulating nature of the $Al_yGa_{1-y}N$ layer 105, the Al content may be increased to about 90% (i.e., y=about 0.9).

Depositing high and low temperature AlN sub-layers 103a/103b and depositing a high temperature $Al_yGa_{1-y}N$ layer 105 may be repeated to increase reflectance, to improve crystallinity and to relieve strain, as demonstrated in FIG. 2.

In alternative embodiments, trimethylaluminum (TMA) and other aluminum metalorganic precursors may be used as an alternative for TEA to initiate growth of the AlN layers 103. Similarly, triethylgallium (TEG) and other gallium metalorganic precursors may be used as an alternative to TMG to initiate growth of the $Al_yGa_{1-y}N$ layer 105. Flow rates of such aluminum and gallium metalorganic precursors can be varied to impact the growth rate of AlN layer 103 and $Al_yGa_{1-y}N$ layer 105. Ratios of ammonia and aluminum and gallium metalorganic precursor molar flow rates along with process pressures can be varied to make further adjustments to the process as would be apparent to one of ordinary skill in the art by routine experimentation.

Optionally, a group III-nitride cap layer 109 may be deposited on top of the DBR layer 107 at between about 950-1150° C., preferably about 1000° C. The thickness and composition of the group III-nitride cap layer 109 may vary depending upon the application of the structure or device 111 contained within the group III-nitride cap layer 109. The group III-nitride cap layer 109 of the present invention, formed on a DBR layer 107, may be grown crack-free to a greater thickness, for example about 500-2000 nm, than a group III-nitride layer grown directly on an AlN/Si substrate, which would have dislocations and/or cracking.

A structure of the present invention may have additional layers deposited, as would be appropriate for a particular application and as would be apparent to one skilled in the art. Further, the method discussed above for fabricating a structure on a $Si_{1-x}Ge_x$ substrate 101 may be achieved in a single reactor representing a single step in a larger device fabrication process flow.

Reflectance

Figure 4A:
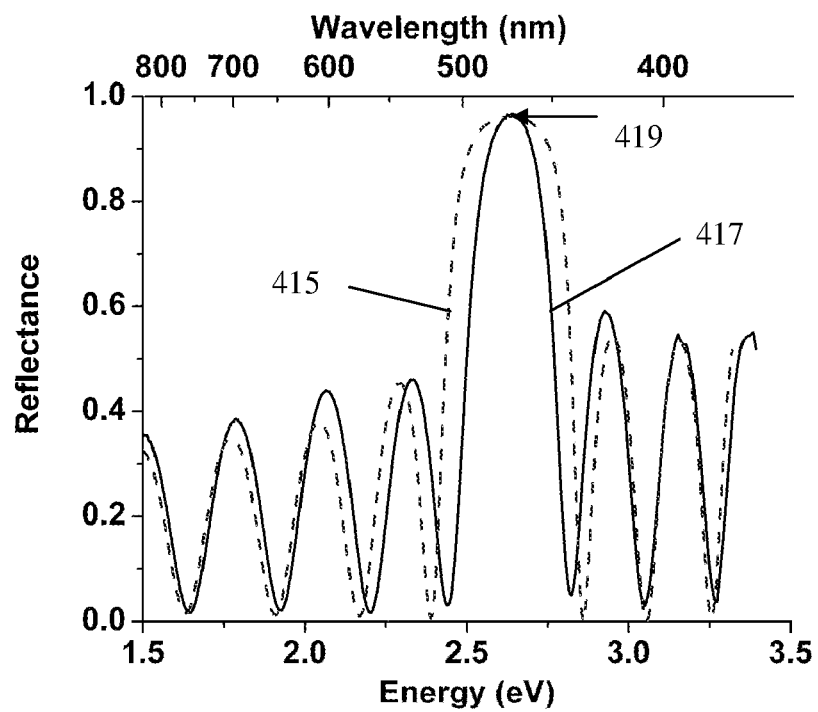
FIG. 4A is a representation of calculated theoretical reflectance and measured experimental reflectance of an example structure of the present invention on a Si (111) substrate.

A structure 100 of the present invention includes the growth of a high-reflectance DBR layer 107 and optionally a crack-free group III-nitride cap layer 109 on a $Si_{1-x}Ge_x$ substrate 101. FIG. 4A illustrates a calculated theoretical reflectance (curve 415) and a measured experimental reflectance (curve 417) of an example structure of the present invention. In the example structure used to provide the data of FIG. 4A, the DBR layer includes AlN/GaN (y equals zero) layers repeated nine times on a Si (111) substrate (x equals zero). The peak reflectance 419 is measured to be about 96.8% at about 2.63 eV and 472 nm. The measured experimental reflectance was measured at normal incidence using a halogen lamp as a source. The reflected beam was dispersed through an Ocean Optics S2000 spectrometer with a 50 µm slit. The theoretical reflectance was calculated via the standard transfer matrix method, as would be apparent to one skilled in the art.

Figure 4B:
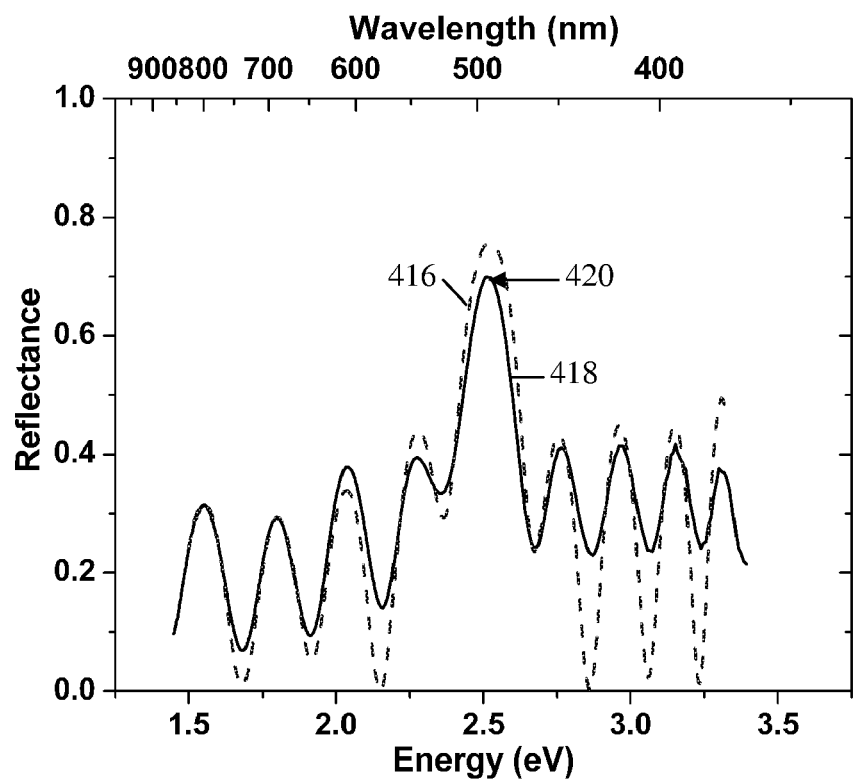
FIG. 4B is a representation of calculated theoretical reflectance and measured experimental reflectance of an example structure of the present invention on a Si (100) substrate.

Similarly, FIG. 4B illustrates a calculated theoretical reflectance (curve 416) and a measured experimental reflectance (curve 418) of an example structure of the present invention. In the example structure used to provide the data of FIG. 4B, the DBR layer includes AlN/GaN (y equals zero) layers repeated only five times on a Si (100) substrate (x equals zero) and a 600 nm GaN cap layer. The peak reflectance 420 is measured to be about 69.8% at about 2.5 eV and 495 nm, which is a good experimental reflectance on a Si (100) substrate.

The thickness of AlN layer 103 and/or $Al_yGa_{1-y}N$ layer 105 may vary based on the requirements needed to create a quarter wave DBR layer 107 for the desired application at a desired wavelength. For example, the overall thickness of the DBR layer 107 limits the thickness of the first AlN layer 103 in the DBR layer 107 to a multiple of $\lambda/4n_{AlN}$, where $\lambda$ is the target wavelength of the device and $n_{AlN}$ is the index of refraction of AlN. For example, the optical thickness for AlN is about 66.1 nm for a quarter wave DBR layer centered at a wavelength of about 543.5 nm. Similarly, the thickness of any layer in the DBR layer 107 can be set to a multiple of the quarter wave optical thickness, or $\lambda/4n_{layer}$, for that particular layer. For example, the optical thickness for GaN is about 59.8 nm for a quarter wave DBR centered at about 543.5 nm.

Along the same lines, the peak reflectance for the DBR layer 107 can be tuned to any point in the UV or visible wavelength spectrum by adjusted the thickness of the AlN and $Al_yGa_{1-y}N$ layers 103/105 in the DBR layer 107. Thus, the peak reflectance of the DBR layer 107 may be adjusted for a particular device that is subsequently deposited on the DBR layer 107 by altering the thickness of the various layers of the DBR layer 107. For example, a blue wavelength LED with an emission at about 420-490 nm, for example specifically at 450 nm, would require a DBR layer 107 with a 54.1 nm thick AlN layer 103 and a 45.3 nm thick GaN layer 105 according to the formula. A UV wavelength LED, with an emission between about 200 and 380 nm, for example specifically at 380 nm, would require a DBR with a 45.0 nm thick AlN layer 103 and a 37.4 nm thick $Al_{0.2}Ga_{0.8}N$ layer 107 according to the formula. A similar structure can be created for a green LED with an emission between 492 to 577 nm. Certain plastic optical fiber applications require a green RCLED, with emission specifically at 510 nm, which would also require a DBR layer 107 with a 61.8 nm thick AlN layer 103 and a 52.4 nm thick GaN layer 105 according to the formula.

Optoelectronic Devices

Placing the DBR layer 107 directly on the $Si_{1-x}Ge_x$ substrate 101 allows for group III-nitride optoelectronic devices on a $Si_{1-x}Ge_x$ substrate that may be designed to reflect emitted light away from the opaque $Si_{1-x}Ge_x$ substrate 100. For example, structure 100 may provide a basis for a number of high efficiency optoelectronics devices on $Si_{1-x}Ge_x$ substrates including LEDs, RCLEDs, photodetectors, photovoltaic cells VCSELs and other related devices as would be apparent to one of ordinary skill in the art.

Figure 5:
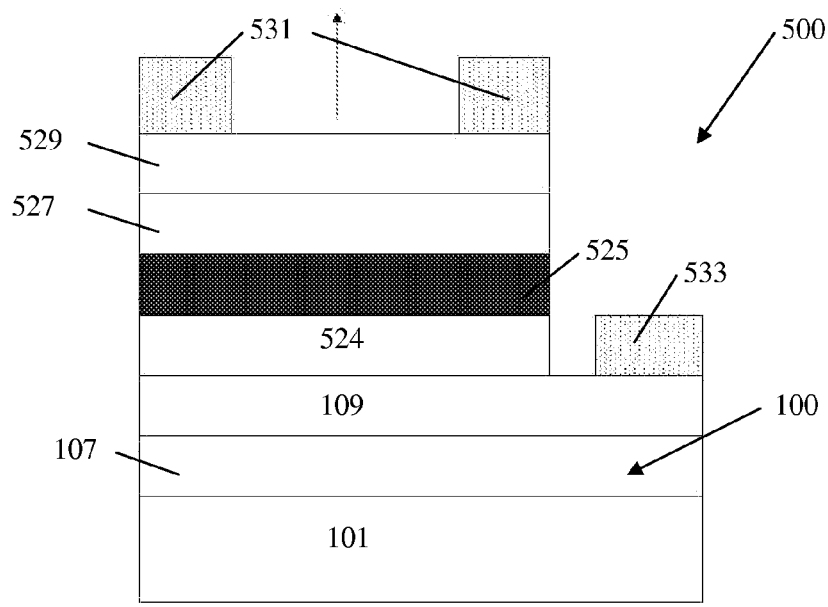
FIG. 5 is a schematic of an embodiment of an LED optoelectronic device of the present invention.

For example, FIG. 5 is a schematic of an example of an optoelectronic LED device 500 of the present invention, including the general structure 100 discussed above. In addition to a $Si_{1-x}Ge_x$ substrate 101, which may incorporate a SiGe epilayer 102, and a DBR layer 107 including, for example, a repeating pattern of AlN and $Al_yGa_{1-y}N$ layers 103/105, the LED device 500 includes a group III-nitride cap layer 109, for example GaN, or an alternative material as would be apparent to one skilled in the art, deposited onto the DBR layer 107, which may be doped, for example with Si or another dopant material as would be apparent to one skilled in the art. An electron injection layer 524 may be deposited onto the cap layer 109. The electron injection layer 524 may be a group III-nitride layer, for example GaN or an indium (In) or Al or both alloy of GaN or another material as would be apparent to one of ordinary skill in the art, which may be doped with Si. An active layer 525 may be deposited onto the electron injection layer 524. Particularly, the active layer 525 may include, for example, AlInGaN for UV emitted light or InGaN for blue or green emitted light, or another material as would be apparent to one skilled in the art, since the materials alloyed for the active layer 525 will alter the wavelength of emitted light. A hole injection layer 527 may be deposited onto the active layer 525, and may include group III-nitride, for example GaN or an In or Al or both alloy of GaN, or other material as would be apparent to one skilled in the art, which may be doped with magnesium. A contact layer 529 may be deposited onto the hole injection layer 527, which may include group III-nitride, for example GaN or an In or Al or both alloy of GaN, or other material as would be apparent to one skilled in the art, which may be doped with magnesium. Finally, contacts 531 and 533 may be added to separate locations on the LED device 500, for example by patterned deposition. Contact 531 may be a ring contact, as shown, or may be an alternative designed contact as would be apparent to one skilled in the art. Contact 531 may be any suitable material apparent to one skilled in the art, for example nickel, gold, silver or a multilayer thereof. Similarly, contact 533 may be any suitable material apparent to one skilled in the art, for example, titanium, aluminum or a multilayer thereof. The thickness of the DBR layer 107, group III-nitride cap layer 109 and electron injection layer 524 may each be determined based on the quarter wave formula discussed above, for example.

Figure 6:
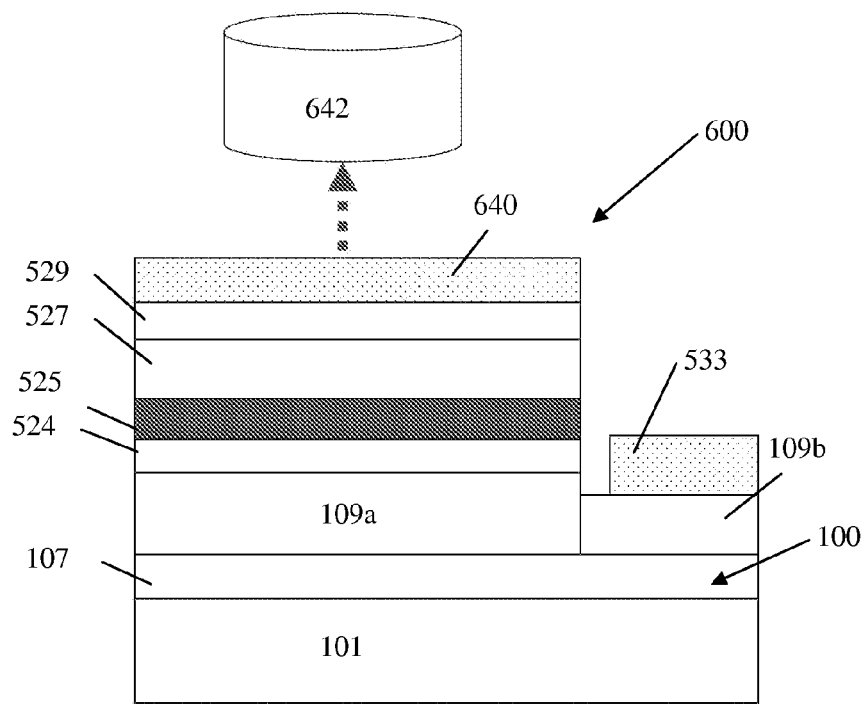
FIG. 6 is a schematic of an embodiment of an RCLED optoelectronic device of the present invention.

FIG. 6 is a schematic of an example of an optoelectronic RCLED device 600 of the present invention. FIG. 6 is similar to FIG. 5 in that it also includes a $Si_{1-x}Ge_x$ substrate 101, which may incorporate a SiGe epilayer 102, a DBR layer 107, a group III-nitride cap layer 109 (which in this example includes two different sections 109a and 109b of different thicknesses, prepared, for example, by post-growth etching section 109b), an electron injection layer 524, an active layer 525, a hole injection layer 527 and a contact layer 529 and contact 533. In this embodiment, however, the high reflectance DBR layer 107, when coupled with a second high reflectance structure 640 deposited over the active layer 525, allows the creation of a light resonant cavity to enhance the efficiency of the optoelectronic RCLED device 600. The emission from the active layer 525 bounces between the DBR layer 107 and the second high reflectance structure 640 to produce a refinement of the spectral and spatial properties of the spontaneous emission process by directing the emission to internal angles less than an angle critical for light to escape the device. In the example of FIG. 6, the second high reflectance structure 640 may be a contact of semi-transparent/reflecting nickel, silver or gold or a multilayer thereof or a contact of a different transparent/reflecting material as would be apparent to one skilled in the art. In alternative embodiments, however, second high reflectance structure 640 could be, for example, a nitride or dielectric DBR layer or possibly a simple metal/air or semiconductor/air interface (not shown) or other material or structure as would be apparent to one of ordinary skill in the art, with or without an additional contact. The example shown in FIG. 6 also includes an optional plastic optical fiber 642 connected to the second high reflectance structure 640 to transmit the emission away from the RCLED device 600.

Figure 7:
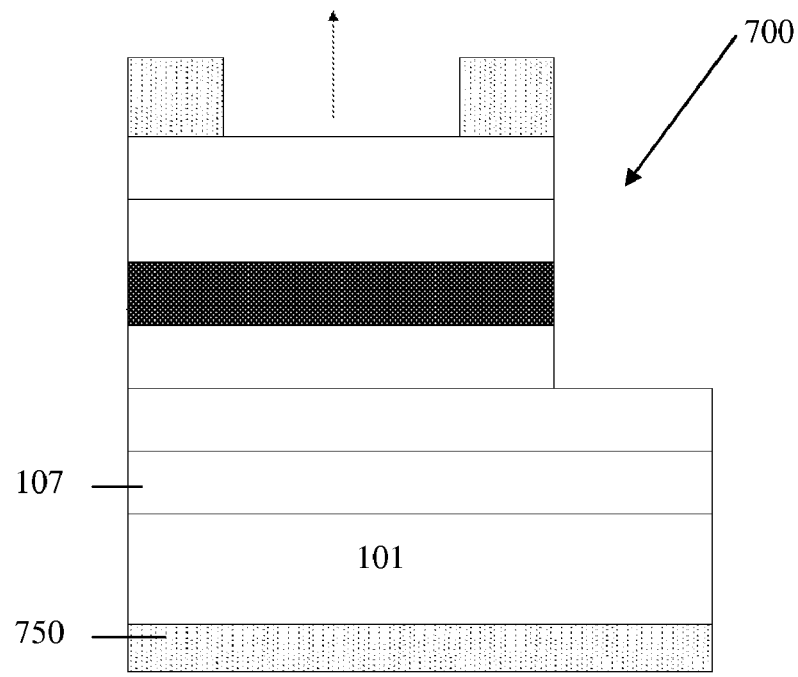
FIG. 7 is a schematic of an embodiment of a vertical LED optoelectronic device of the present invention.
Figure 8:
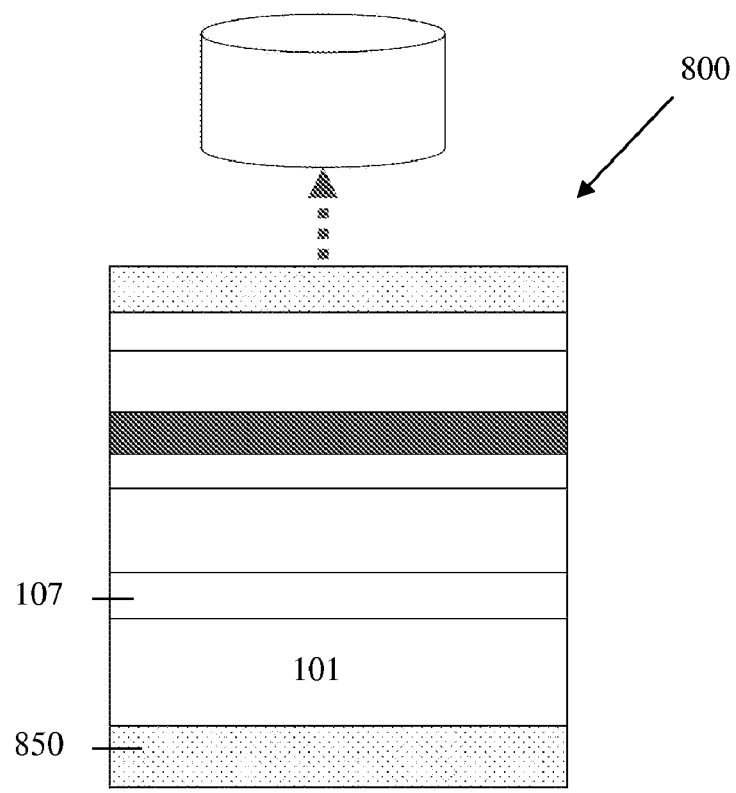
FIG. 8 is a schematic of an embodiment of a vertical RCLED optoelectronic device of the present invention.

In an alternative embodiment of the present invention, it was found that, by doping the DBR layer 107 with a Si component, the conductance of the DBR layer 107 is sufficiently high to enable vertical devices, including a contact on the backside of the $Si_{1-x}Ge_x$ substrate 101. While an undoped DBR layer 107 that is preferably thicker than about 1000 nm and has high AlN content, y, in the $Al_yGa_{1-y}N$ layers will provide good electrical isolation for the device, a thinner and/or doped DBR layer 107 would allow the creation of a vertical group III-nitride device on a $Si_{1-x}Ge_x$ substrate 101 with a backside contact. For example, a DBR layer 107 having AlN/$Al_yGa_{1-y}N$ layers repeated seven times can be doped with Si (such as, $SiH_4$ or $Si_2H_6$) to have a resistance of about 10 Ω-cm. Meanwhile an identical undoped DBR layer 107 had a resistance of about $2 \times 10^3$ Ω-cm with a 300 V breakdown. One of ordinary skill in the art may tailor the resistance of the doped DBR layer 107 over an even broader range by adjusting the doping level(s) via routine experimentation. FIG. 7 is a schematic of an example of a vertical LED device 700 of the present invention, and FIG. 8 is a schematic of an example of a vertical RCLED device 800 of the present invention. FIG. 7 and FIG. 8 are nearly identical to FIGS. 5 and 6, expect the DBR layer 107 is doped and a contact 750/850 is added to the opposite side of the $Si_{1-x}Ge_x$ substrate 101 from the DBR layer 107.

To those of ordinary skill in the art, alternative optoelectronic devices can be made, for example, by introducing additional or alternative layers, for example, for improved current injection, optical confinement and stress management.

Electronic Devices

An electronic device, for example a group III-nitride HEMT or heterojunction bipolar transistor (HBT), can be built directly on the DBR layer 107. In this case, the DBR layer 107 effectively compensates strain and filters dislocation such that an electronic device would be operable on a $Si_{1-x}Ge_x$ substrate 101. An undoped DBR layer 107, including thin insulating AlN layers 103 will electrically isolate the group III-nitride device from the $Si_{1-x}Ge_x$ substrate 101. The period of the DBR layer 107 can be varied from 5 nm to 500 nm to maximize strain compensation and electrical isolation.

Figure 9:
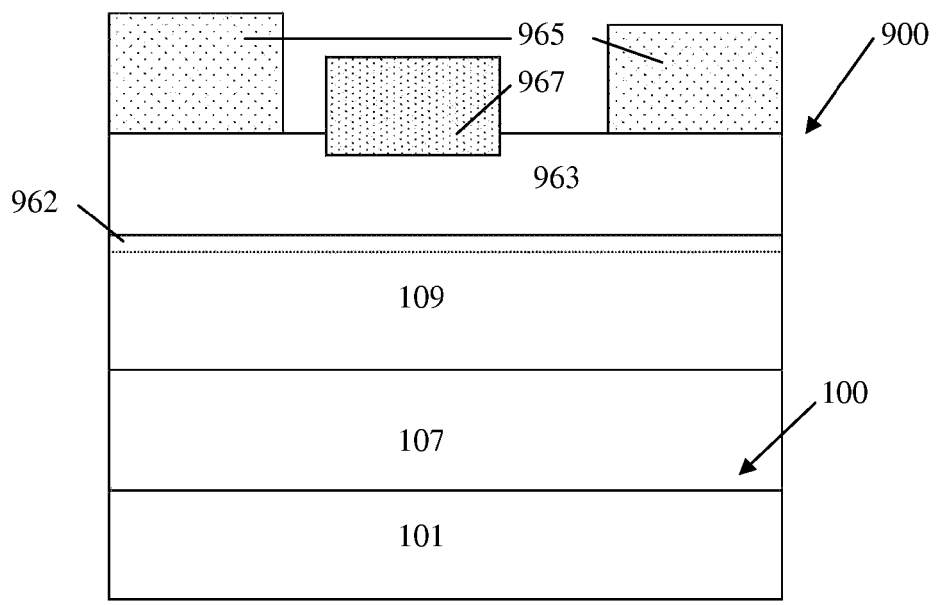
FIG. 9 is a schematic of an embodiment of an HEMT electronic device of the present invention.

FIG. 9 illustrates a simplified schematic of an example of a HEMT device 900 of the present invention, incorporating the general structure 100. Specifically, the HEMT device 900 incorporates a $Si_{1-x}Ge_x$ substrate 101, which may incorporate a SiGe epilayer 102, a DBR layer 107, an undoped group III-nitride cap layer 109, an n-type group III-nitride layer 963 (having a different bandgap than the group III-nitride cap layer 109), at least one ohmic contact 965 and a Schottky contact 967. A two dimensional electron gas (2DEG) channel 962 is exhibited at the interface between undoped group III-nitride cap layer 109 and n-type group III-nitride layer 963. The DBR layer 107 is preferably undoped AlN/$Al_yGa_{1-y}N$ layers. Preferably, the Al content, y, may be greater than 0.5 and the overall thickness of the DBR layer 107 may be at least about 1 μm to about 5 μm to maximize resistance of the DBR layer 107 and minimize the latch up between the electronic components and the $Si_{1-x}Ge_x$ substrate 101. Further, the undoped group III-nitride cap layer 109 preferably may be undoped GaN and may be less than 50 nm thick for quantum well confinement or over about 1 μm thick for conductivity isolation. The n-type group III-nitride layer 963 may be an $Al_yGa_{1-y}N$ layer with y equal to about 0.25 and about 25 nm thick. The ohmic contacts 965 may be made from any material that would be apparent to one of ordinary skill in the art, for example, titanium, aluminum or a multilayer thereof. Similarly, the Schottky contact 967 may be made from any material that would be apparent to one of ordinary skill in the art, for example, titanium, nickel, gold or a multilayer thereof. The design of ohmic contacts 965 and Schottky contact 967 may be provided by patterned deposition.

Figure 10:
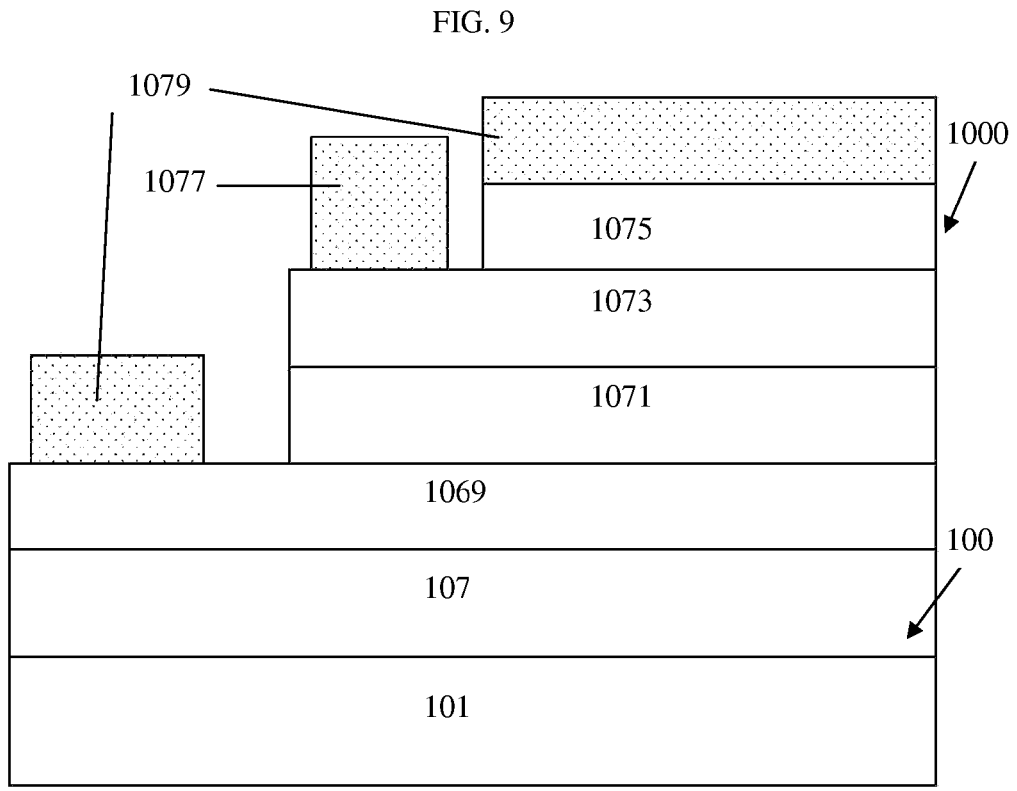
FIG. 10 is a schematic of an embodiment of an HBT electronic device of the present invention.

FIG. 10 is a simplified schematic of an example of a HBT device 1000 of the present invention, incorporating the general structure 100, with a $Si_{1-x}Ge_x$ substrate 101, which may incorporate a SiGe epilayer 102, and a DBR layer 107. The DBR layer 107 in this example preferably may be repeating layers of $AlN/Al_yGa_{1-y}N$, wherein y is greater than 0.5 to increase resistance. Instead of the optional cap layer 109, the HBT device 1000 includes a sub-collector 1069, which may be n+ group III nitride, for example GaN or an In or Al or both alloy of GaN or another material as would be apparent to one skilled in the art, and may be deposited to a thickness of about 0.5 µm. A collector 1071 may be deposited onto the sub-collector 1069, for example by patterned growth. The collector 1071 may be, for example, n⁻ group III-nitride, for example GaN or an In or Al or both alloy of GaN or another material as would be apparent to one skilled in the art, and may be deposited to a thickness of about 0.4 µm. A base layer 1073 may be deposited onto the collector 1071. The base layer 1073 may be, for example, p-type group III-nitride, for example GaN or an In or Al or both alloy of GaN or another material as would be apparent to one skilled in the art, and may be deposited to a thickness of about 0.15 µm. An emitter 1075 may be deposited onto the base layer 1073, for example by patterned growth. The emitter may be, for example, $n^+/n$ group III-nitride, for example GaN or an In or Al or both alloy of GaN or another material as would be apparent to one skilled in the art, and may be deposited to a thickness of about 0.8 µm. Further, ohmic contacts 1077/1079 may be added to HBT device 1000, for example by patterned deposition. Ohmic contacts 1079 may be made from any material apparent to one of ordinary skill in the art, for example titanium, aluminum or a multilayer thereof and may be deposited onto sub-collector 1069 and emitter 1075, respectively. Ohmic contact 1077 may also be made from any material apparent to one skilled in the art, for example, titanium, aluminum, nickel, gold or a multilayer thereof and may be deposited onto base layer 1073.

As would be apparent to one of ordinary skill in the art, an electronic device of the present invention alternatively may include additional or alternative layers, for example for improved current injection and stress management, particularly at the interface that forms the 2DEG channel in the HEMT device.

Typically, an AlN layer has very high resistance and thus the DBR layer 107 can be used to insulate or isolate electronic components. However, lowering the deposition temperature also lowers the resistance of AlN layers 103, likely due to conductive defects in the AlN introduced during low-temperature growth. Thus, the resistance may be decreased by depositing AlN layer 103 at lower temperatures as discussed above with respect to AlN sub-layer 103*b*. Alternatively, the resistance of the DBR layer 107 can be increased by increasing the growth temperature of AlN layer 103 or increasing the total thickness of the DBR layer 107.

Additionally, resistance and breakdown voltage of the $AlN/Al_yGa_{1-y}N$ layers 103/105 can be increased by increasing the AlN content, y, in the $Al_yGa_{1-y}N$ layers to y greater than about 0.3, preferably y greater than about 0.6. Consequently, a structure of the present invention may be particularly useful for electronic devices, since the structure of the present invention contemplates using various manufacturing and composition techniques to control several electrical device parasitics, including resistance, capacitance, and crosstalk, that impact signal speeds, power consumption, and operational limits.

Microelectrical Mechanical Devices

Figure 11:
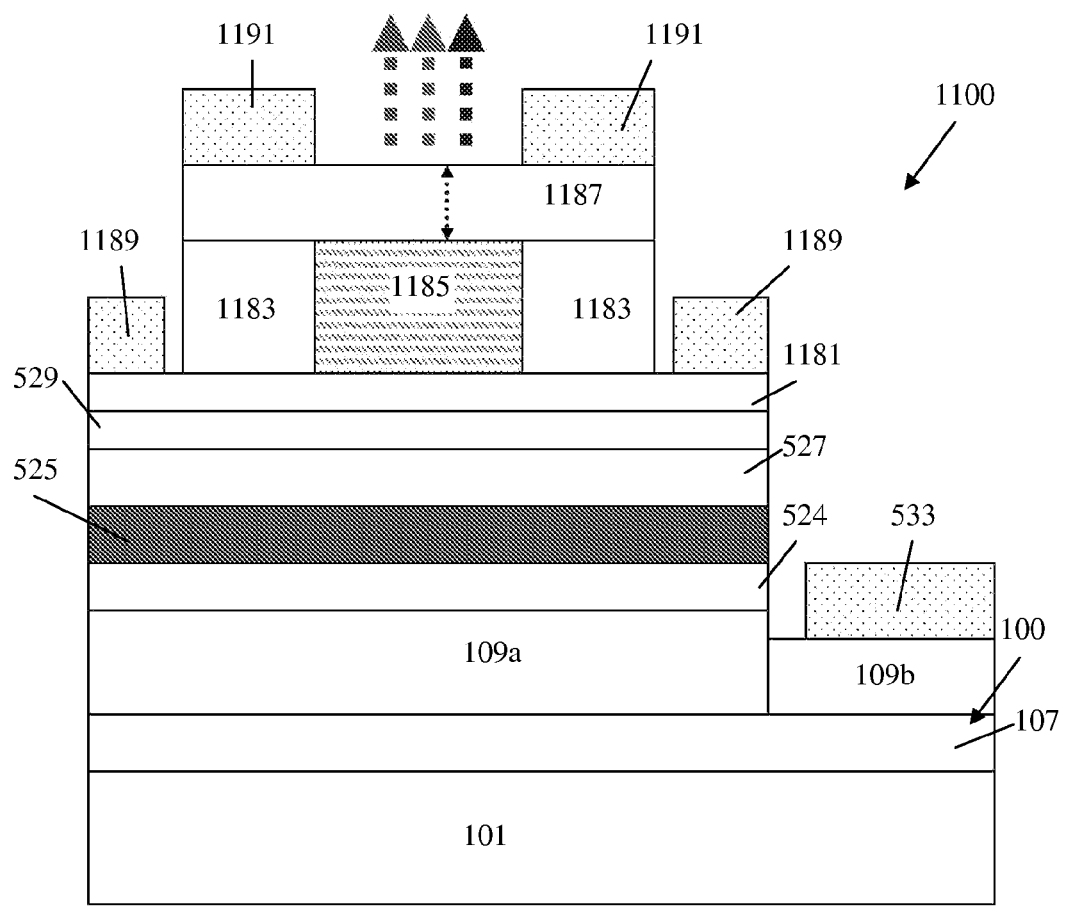
FIG. 11 is a schematic of an embodiment of a microelectrical mechanical device of the present invention.

FIG. 11 is a simplified schematic for a microelectrical mechanical (MEM) device or microelectrial mechanical system (MEMS) 1100 incorporating structure 100 of the present invention, including a $Si_{1-x}Ge_x$ substrate 101, which may incorporate a SiGe epilayer 102, and a DBR layer 107. MEM device 1100 also includes a group III-nitride cap layer 109 deposited in separate sections 109*a* and 109*b*, for example by patterned growth or post-growth etching of section 109*b*. Similar to the optoelectronic devices, preferably the group III-nitride cap layer 109 may be GaN doped with Si. Also, like the optoelectronic devices of FIGS. 5 and 6, MEM device 1100 includes an electron injection layer 524, an active layer 525, a hole injection layer 527, a contact layer 529 and a contact 533 deposited onto the group III-nitride cap layer section 109*b*.

Deposited onto the contact layer 529 is a tunnel junction 1181. The tunnel junction 1181 may be an $n^{++}$ group III-nitride, for example GaN or an In or Al or both alloy of GaN or another material as would be apparent to one skilled in the art. A temporary layer 1185 and surrounding insulating regions 1183 may be deposited, for example by patterned growth, onto the tunnel junction 1181. The temporary layer 1185 may be, for example, a $SiN_x$ or $SiO_2$ strip or disc or another material as would be apparent to one skilled in the art. The insulating regions 1183 may be, for example, $Al_yGa_{1-y}N$ or another material as would be apparent to one skilled in the art. A membrane layer 1187 is then deposited over the temporary layer 1185 and insulating regions 1183. The membrane layer 1187 may be $n^+/p^+$ group III-nitride, for example GaN or an In or Al or both alloy of GaN or another material as would be apparent to one skilled in the art, preferably with a low Al content. The temporary layer 1185 is then removed, for example by an etching method or another method apparent to one of ordinary skill in the art, leaving a cavity 1185 where the temporary layer 1185 once was present. A tuning contact 1189 may be deposited, for example by patterned deposition, onto the tunnel junction 1181 and a contact 1191 may be deposited onto the membrane 1187. The tuning contact 1189 and contacts 1191 may be any material apparent to one skilled in the art, for example titanium, aluminum or a multilayer thereof and may be ring contacts, as shown, or an alternative designed contact as would be apparent to one skilled in the art.

Using the tuning contact 1189 and contact 1191, a bias voltage can be applied across the insulating regions 1183, cavity 1185 and membrane 1187. A low Al content in membrane 1187 ensures a good ohmic contact (i.e., no turn-on voltage and relatively low resistance). A reverse bias across the contacts 1191 and 1189 creates an electrostatic force that deflects the membrane 1187 towards the active layer 525 reducing the height of the cavity 1185. Controlling the amount that membrane 1187 deflects changes the resonance of light across cavity 1185 and the peak wavelength of light emission in a controlled manner. Depending upon the application, the color emitted from the MEM device 1100 may be alterable by applying a controlled bias voltage.

A MEM device of the present invention may include additional or alternative layers as needed for a particular application as would be apparent to one skilled in the art. Alternatively, one skilled in the art can appreciate that such a membrane may be applied to other alternative MEM devices and that such MEM devices may perform alternative micromechanical functions as would be apparent to one skilled in the art.

Photodetectors

Photodetectors operate by exciting electrons across the bandgap, i.e., from the valence band to the conduction band. This can occur when light (photons) impinges on a semiconductor with an energy larger than the semiconductor bandgap. The photo-excited electrons are collected by applying an external bias to generate an internal electric field across a p-n junction. Si will absorb light with a wavelength less than 1100 nm, Ge will absorb light with a wavelength less than 1700 nm, with the band-edge and, thus absorption range of a $Si_{1-x}Ge_x$ alloy being approximately linearly dependent on the Ge content, x. As such, Si (having a bandgap energy of $E_g$=1.12 eV), Ge (having a bandgap energy of $E_g$=0.66 eV) or an alloy of the two can be used for detection of light in the visible and Infrared (IR) spectrums. Additionally, a SiGe/Si quantum well infrared photodetector can be designed to absorb even larger wavelengths (e.g., 3-5 μm and 8-12 μm), which are of interest due to minimum atmospheric attenuation in these bands. This radiation has energies in the 0.1-0.4 eV range. Conventional semiconductors cannot be used because the bandgap energy of conventional substrate material is too high. Similarly, the group III-nitrides with bandgaps that can be varied from 6.2 eV to 0.9 eV can detect light from the UV to the IR spectrum of wavelengths.

The ability to deposit group III-nitride structures on $Si_{1-x}Ge_x$, which may incorporate a SiGe epilayer, allows the creation of dual-junction photodetector devices. For example, a dual-junction photodetector device may be able to detect integrated yet distinct UV/IR or visible/IR wavelengths. Specifically, a group III-nitride device formed in the group III-nitride active layers would filter the higher energy (shorter visible and UV wavelength) photons, and a $Si_{1-x}Ge_x$ substrate device formed in the $Si_{1-x}Ge_x$ substrate 101 would detect/absorb the lower energy (longer visible and IR wavelength) photons. Additionally, the DBR layer 107 would enhance this selectivity.

Figure 12:
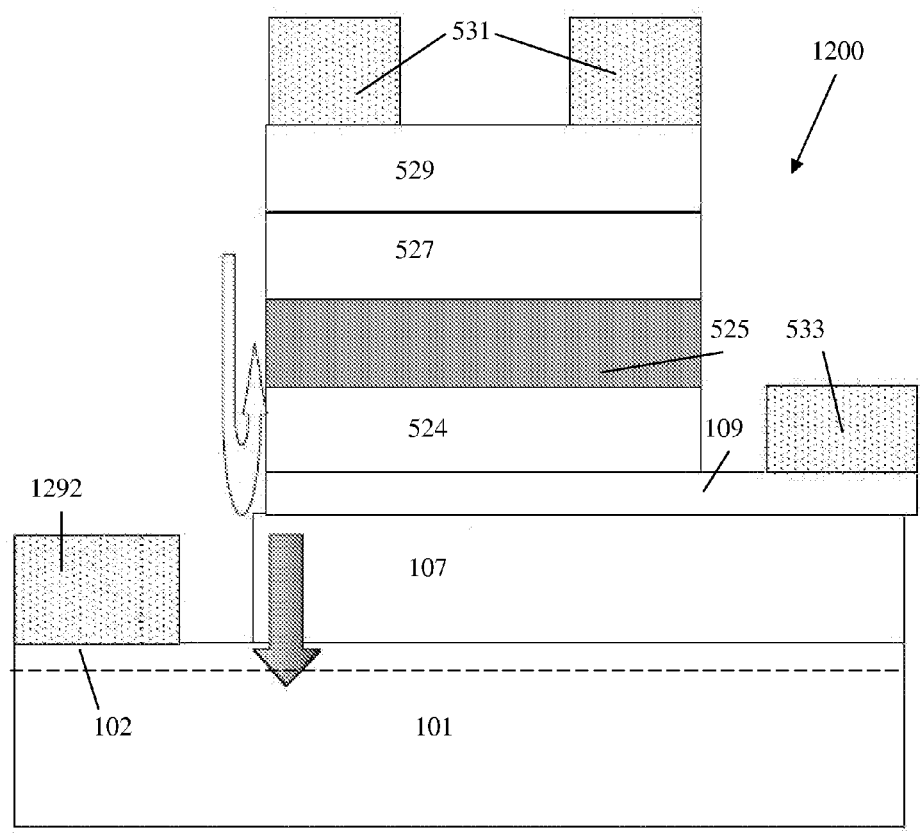
FIG. 12 is a schematic of an embodiment of a photodetector or photovoltaic cell device of the present invention.

FIG. 12 is a schematic of an example of a photodetector device 1200 of the present invention. FIG. 12 is similar to FIG. 5 in that it includes a $Si_{1-x}Ge_x$ substrate 101, which may incorporate a SiGe epilayer 102, a DBR layer 107, a group III-nitride cap layer 109, an electron injection layer 524, an active layer 525, a hole injection layer 527, a contact layer 529 and contacts 531/533. In this embodiment, however, another contact 1292 is provided on the $Si_{1-x}Ge_x$ substrate 101.

A single-use photodetector may simply rely on the group III-nitride active layers for absorbing across the spectrum of light. The single-use photodetector may have contact 1292 omitted, such that energy is absorbed only in the group III-nitride active layers. The DBR layer 107 will reflect any unabsorbed light back towards the active layers, increasing the sensitivity of the single-use photodetector.

In order to achieve a dual-junction photodetector device, the $Si_{1-x}Ge_x$ substrate 101, most likely incorporating a SiGe epilayer 102, will contain a separate photodetecting device by including a p/n or p/i/n junction to absorb (for example long visible and IR) photons that are not reflected by the DBR layer 107. For example, a Si substrate 101 may be doped to form an n-type layer, while a SiGe epilayer 102 may be doped to form a p-type layer to form the separate photodetecting device in the substrate 101. The group III-nitride photodetecting device deposited on the DBR layer 107, as described above, also contains a p/n or p/i/n junction to absorb the light in the range of the higher energy bandgap.

Alternatively, the dual-junction photodetector could be fabricated and operated by placing the group III-nitride and $Si_{1-x}Ge_x$ substrate devices in adjacent regions. For example, the group III-nitride device may be selectively grown, for example in an oxide opening on the SiGe substrate device. In this embodiment, the entire range of incident light will be directed to both devices individually.

A single- or dual-junction photodetector device of the present invention may have additional or alternative layers as desired for a particular application as would be apparent to one skilled in the art. For example, in the stacked photodetector of FIG. 12, the structure may further include a $p^{++}/n^{++}$ tunnel junction to electrically connect the $Si_{1-x}Ge_x$ substrate photodetecting device to the group III-nitride photodetecting device, which may be useful for measuring or detecting total amounts of photon energy across the spectrum. Also, in order to measure voltage across just the substrate photodetecting device, the DBR layer 107 may be doped and a contact may be added to the opposite side of the $Si_{1-x}Ge_x$ substrate 101 from the DBR layer 107.

Photovoltaic Cell

FIG. 12 also generally describes the structure of a photovoltaic cell device for energy harvesting, such as a solar cell. For a photovoltaic cell device response time, i.e., frequency of measurements and wavelength selectivity, are not factors to be considered. Rather, it is desirable to absorb the maximum amount of the solar spectrum. Thus, in the embodiment of the photovoltaic cell device, the DBR layer 107 may not be preferred since some energy may be lost due to reflectance. Nonetheless, in another embodiment, the presence of a DBR layer 107 would recycle the blue-green wavelength light, which is at the DBR layer 107 resonant (or peak) wavelength. Thus, any unabsorbed energy will be recycled and thus further available for absorption.

The photovoltaic cell device of the present invention, like the photodetector may be a single- or dual-junction device. In a dual-junction device, the Si or SiGe device will absorb some light at energies larger than its bandgap, i.e., shorter visible and UV, in addition to the lower energy photons. However, the advantage of using the group III-nitride device to additionally absorb light is that the wide-bandgap of a group III-nitride device is more efficient at converting higher energy light to electrons (for example, UV/blue/green for InGaN). Further, Ge has a smaller bandgap, which makes a SiGe device absorptive at lower energies and longer wavelengths than Si alone. Thus, a higher efficiency photovoltaic cell, i.e., a dual-junction solar cell, may be constructed by designing the group III-nitride device using the bandgap of the $Si_{1-x}Ge_x$ substrate device as a parameter. It also may be desirable to utilize the peak in the solar spectrum intensity in the blue-green wavelengths as a design parameter, for example using an $In_{0.2}GaN_{0.8}N$ group III-nitride active layer 525 with a bandgap near the blue-green. As with the photodetector, the photovoltaic cell may include a $p^{++}/n^{++}$ tunnel junction to electrically connect the $Si_{1-x}Ge_x$ substrate device to the group III-nitride device. In the photovoltaic cell device, the ohmic contact 533 may be removed if a vertical conduction through the tunnel junction is desired.

Integrated Circuits

One or more similar or dissimilar group III-nitride devices may be integrated onto one $Si_{1-x}Ge_x$ substrate 101, or one $Si_{1-x}Ge_x$ wafer. Individual devices (or nanostructures of a larger device) may be fabricated by conducting the growth of DBR layer 107 and/or any subsequent layers in an oxide, or resist, opening on a $Si_{1-x}Ge_x$ substrate 101 or, for example, on $Si_{1-x}Ge_x$ mesas disposed on a $Si_{1-x}Ge_x$ substrate 101. Alternative methods for controlled deposition of materials, such as post-growth etching, may also be used as would be apparent to one skilled in the art. The AlN/$Al_yGa_{1-y}$N layers 103/105 of a DBR layer 107 on a $Si_{1-x}Ge_x$ substrate 101 may provide for several group III-nitride electronic devices, including but not limited to LEDs, RCLEDs, HEMTs, HBTs, photodetectors, photovoltaic cells and Schottky diodes.

Figure 13:
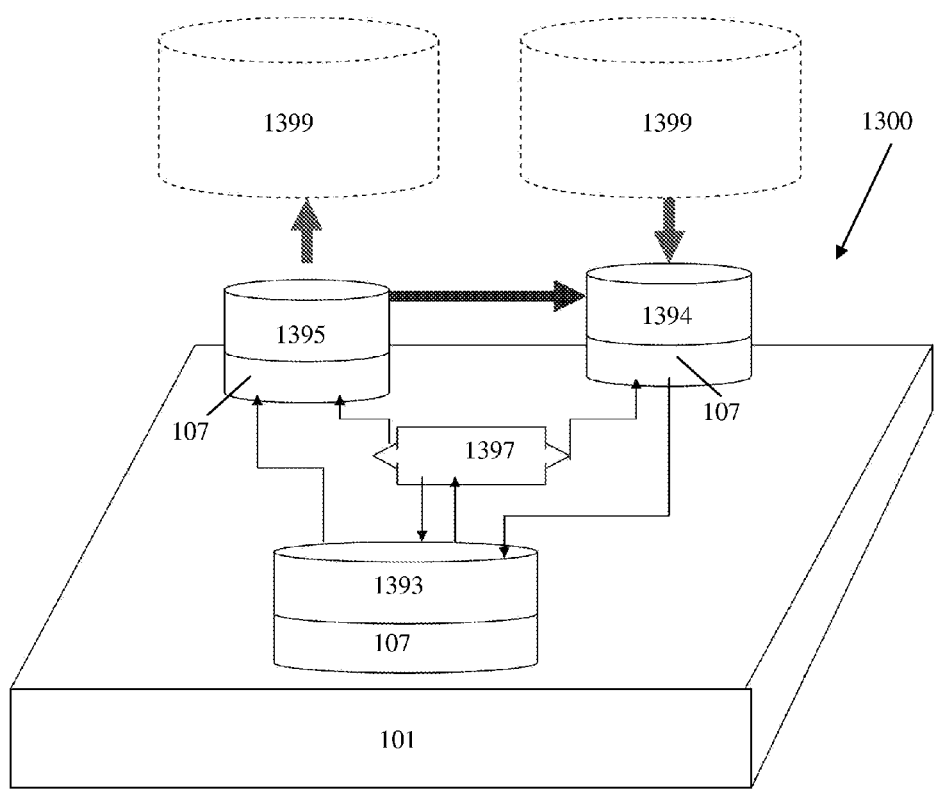
FIG. 13 is a schematic of an embodiment of an integrated circuit of the present invention.
Figure 14:
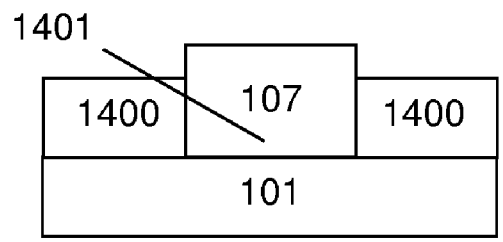
FIG. 14 is a schematic of an embodiment of a distributed Bragg reflector layer 107 selectively grown in an oxide 1400 opening 1401 deposited on a $Si_{1-x}Ge_x$ substrate 101.
Figure 15:
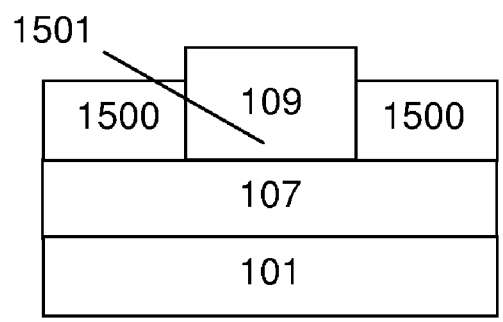
FIG. 15 is a schematic of an embodiment of a group III-nitride layer 109 selectively grown in an oxide 1500 opening 1501 deposited on a distributed Bragg reflector layer 107 deposited on a $Si_{1-x}Ge_x$ substrate 101.
Figure 16:
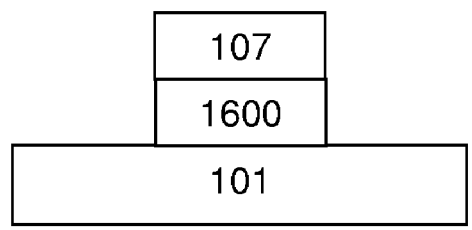
FIG. 16 is a schematic of an embodiment of a $Si_{1-x}Ge_x$ mesa 1600 disposed on a $Si_{1-x}Ge_x$ substrate 101 and a distributed Bragg reflector layer 107 disposed on the $Si_{1-x}Ge_x$ mesa.

For example, FIG. 13 is a schematic of an example of a $Si_{1-x}Ge_x$ integrated circuit 1300 including both electronic and optoelectronic devices. In this example, a DBR layer 107 is deposited in three isolated areas, for example by patterned growth or post-growth etching, onto a $Si_{1-x}Ge_x$ substrate 101, which may incorporate a SiGe epilayer 102. An electronic device 1393 may be deposited over one DBR layer 107, such as an HBT or HEMT from FIGS. 9 and 10. An optoelectronic device 1395 may be deposited over a second DBR layer 107, such as an LED or RCLED from FIGS. 5 and 6. Yet another device 1394 may be deposited over a third DBR layer 107, such as a photodetector or photovoltaic cell of FIG. 12. Additionally, the devices 1393, 1394, and 1395 can be integrated with various high power or high voltage $Si_{1-x}Ge_x$ electronics 1397 fabricated on the same $Si_{1-x}Ge_x$ substrate 101, as would be apparent to one skilled in the art. Further, optical fibers 1399 may be added to transmit emitted light from or to the various devices. In an alternative embodiment, a continuous DBR layer 107 may be grown on the entire $Si_{1-x}Ge_x$ substrate 101, with the various devices 1393, 1394, 1395 subsequently defined during processing, such as by patterned growth or post-growth etching.

An integrated circuit of the present invention may have additional or alternative devices, layers or other characteristics as desired for various applications as would be apparent to one skilled in the art.

While the invention has been particularly shown and described with reference to preferred embodiments thereof, it will be understood by those skilled in the art that they have been presented by way of example only, and not limitation, and various changes in form and details can be made therein without departing from the spirit and scope of the invention. Thus, the breadth and scope of the present invention should not be limited by any of the above-described exemplary embodiments, but should be defined only in accordance with the following claims and their equivalents. Additionally, all references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed as new and desired to be protected by Letters Patent of the United States is:

1. A structure comprising:
   a $Si_{1-x}Ge_x$ substrate,
      wherein $0 \leq x < 1$;
   a distributed Bragg reflector layer disposed directly onto $Si_{1-x}Ge_x$,
      wherein the distributed Bragg reflector layer includes a repeating pattern of at least one aluminum nitride layer followed by a second layer having the general formula $Al_yGa_{1-y}$N deposited onto the at least one aluminum nitride layer,
      wherein the repeated pattern is repeated only between two and nine times, and
      wherein $0 \leq y < 1$.

2. The structure of claim 1, wherein x is zero.

3. The structure of claim 2, wherein the substrate incorporates a silicon-germanium epilayer upon which the distributed Bragg reflector layer is directly disposed.

4. The structure of claim 1, further comprising a group III-nitride cap layer disposed on the distributed Bragg reflector layer.

5. The structure of claim 1, wherein each aluminum nitride layer includes a high-temperature aluminum nitride sub-layer and a low-temperature aluminum nitride sub-layer disposed on the high-temperature aluminum nitride sub-layer.

6. The structure of claim 1, wherein
   the $Si_{1-x}Ge_x$ substrate is silicon (111) and
   the structure has a measured reflectance that is greater than 78%.

7. The structure of claim 1, wherein
   the $Si_{1-x}Ge_x$ substrate is silicon (100) and
   the structure has a measured reflectance that is greater than about 69.8%.

8. The structure of claim 1,
   wherein the thickness of each aluminum nitride layer equals a multiple of $\lambda/4n_{AlN}$,
   where $\lambda$ is the target wavelength of the structure and $n_{AlN}$ is the index of refraction of AlN wavelength.

9. The structure of claim 1, wherein y is zero.

10. The structure of claim 1, wherein a measured peak reflectance is in the blue-green wavelength range.

11. The structure of claim 1, wherein a measured peak reflectance is in the ultraviolet wavelength range.

12. The structure of claim 1, wherein the distributed Bragg reflector layer is doped with a silicon component.

13. The structure of claim 12, wherein the silicon component is selected from the group consisting of $SiH_4$ and $Si_2H_6$.

14. The structure of claim 1, wherein
   the structure is a vertical device
   the structure further comprises a contact disposed on an opposite side of the $Si_{1-x}Ge_x$ substrate from the side on which the distributed Bragg reflector layer is disposed; and
   the contact provides a conductive path for a current generated across at least one of the $Si_{1-x}Ge_x$ substrate and the distributed Bragg reflector layer.

15. An integrated circuit comprising more than one of the structure of claim 1,
   wherein the $Si_{1-x}Ge_x$ substrate of each structure is a portion of a single $Si_{1-x}Ge_x$ wafer and
   wherein each structure is integrated with at least one other structure via $Si_{1-x}Ge_x$ electronics deposited on the single $Si_{1-x}Ge_x$ wafer.

16. The structure of claim 1, wherein the distributed Bragg reflector layer is selectively grown in an oxide opening deposited on the $Si_{1-x}Ge_x$ substrate.

17. The structure of claim 1, wherein at least one group III-nitride layer is selectively grown in an oxide opening deposited on the distributed Bragg reflector layer.

18. The structure of claim 1, further comprising at least one $Si_{1-x}Ge_x$ mesa disposed on the $Si_{1-x}Ge_x$ substrate and wherein the distributed Bragg reflector layer is disposed on the $Si_{1-x}Ge_x$ mesa.

19. The structure of claim 1,
wherein the $Si_{1-x}Ge_x$ substrate is doped to form a p/n or p/i/n junction;
wherein the device further comprises a group III-nitride device deposited onto the Bragg reflector layer; and
wherein the structure further comprises contacts,
wherein the contacts provide a conductive path for a current generated across at least one of the $Si_{1-x}Ge_x$ substrate device and the group III-nitride device upon incident light
wherein the device is selected from the group consisting of a photovoltaic cell and a photodetector.

20. An integrated circuit comprising more than one of the structure of claim 1,
wherein the $Si_{1-x}Ge_x$ substrate of each structure is a portion of a single $Si_{1-x}Ge_x$ wafer; and
wherein each structure is integrated with at least one other structure via $Si_{1-x}Ge_x$ electronics deposited on the single $Si_{1-x}Ge_x$ wafer.

21. A structure comprising:
a $Si_{1-x}Ge_x$ substrate;
wherein $0 \leq x < 1$;
a distributed Bragg reflector layer disposed directly onto $Si_{1-x}Ge_x$;
wherein the distributed Bragg reflector layer includes a repeating pattern of at least one aluminum nitride layer followed by a second layer having the general formula $Al_yGa_{1-y}N$ deposited onto the at least one aluminum nitride layer; and
wherein $0 \leq y < 1$; and
a contact disposed on an opposite side of the $Si_{1-x}Ge_x$ substrate from the side on which the distributed Bragg reflector layer is disposed;
wherein the structure is a vertical device; and
wherein the contact provides a conductive path for a current generated across at least one of the $Si_{1-x}Ge_x$ substrate and the distributed Bragg reflector layer.

22. The structure of claim 21, wherein x is zero.

23. The structure of claim 22, wherein the substrate incorporates a silicon-germanium epilayer upon which the distributed Bragg reflector layer is directly disposed.

24. The structure of claim 21, further comprising a group III-nitride cap layer disposed on the distributed Bragg reflector layer.

25. The structure of claim 21, wherein each aluminum nitride layer includes a high-temperature aluminum nitride sub-layer and a low-temperature aluminum nitride sub-layer disposed on the high-temperature aluminum nitride sub-layer.

26. The structure of claim 21, wherein
the $Si_{1-x}Ge_x$ substrate is silicon (111) and
the structure has a measured reflectance that is greater than 78%.

27. The structure of claim 21, wherein
the $Si_{1-x}Ge_x$ substrate is silicon (100) and
the structure has a measured reflectance that is greater than about 69.8%.

28. The structure of claim 21,
wherein the thickness of each aluminum nitride layer equals a multiple of $\lambda/4n_{AlN}$,
where $\lambda$ is the target wavelength of the structure and $n_{AlN}$ is the index of refraction of AlN wavelength.

29. The structure of claim 21, wherein y is zero.

30. The structure of claim 21, wherein a measured peak reflectance is in the blue-green wavelength range.

31. The structure of claim 21, wherein a measured peak reflectance is in the ultraviolet wavelength range.

32. The structure of claim 21, wherein the distributed Bragg reflector layer is doped with a silicon component.

33. The structure of claim 32, wherein the silicon component is selected from the group consisting of $SiH_4$ and $Si_2H_6$.

34. The structure of claim 21, wherein the distributed Bragg reflector layer is selectively grown in an oxide opening deposited on the $Si_{1-x}Ge_x$ substrate.

35. The structure of claim 21, wherein at least one group III-nitride layer is selectively grown in an oxide opening deposited on the distributed Bragg reflector layer.

36. The structure of claim 21, further comprising at least one $Si_{1-x}Ge_x$ mesa disposed on the $Si_{1-x}Ge_x$ substrate and wherein the distributed Bragg reflector layer is disposed on the $Si_{1-x}Ge_x$ mesa.

37. A method of forming a structure comprising:
providing a $Si_{1-x}Ge_x$ substrate, wherein $0 \leq x < 1$;
depositing a distributed Bragg reflector layer directly onto the substrate,
wherein depositing the distributed Bragg reflector layer includes depositing at least one aluminum nitride layer onto the substrate and depositing a second layer having the general formula $Al_yGa_{1-y}N$ onto the at least one aluminum nitride layer,
wherein $0 \leq y < 1$,
wherein depositing at least one aluminum nitride layer and depositing a second layer having the general formula $Al_yGa_{1-y}N$ are repeated to form the distributed Bragg reflector layer,
wherein the repeated pattern is repeated only between two and nine times.

38. A method of forming a structure comprising:
providing a $Si_{1-x}Ge_x$ substrate, wherein $0 \leq x < 1$;
depositing a distributed Bragg reflector layer directly onto the substrate;
wherein depositing the distributed Bragg reflector layer includes depositing at least one aluminum nitride layer onto the substrate and depositing a second layer having the general formula $Al_yGa_{1-y}N$ onto the at least one aluminum nitride layer;
wherein $0 \leq y < 1$;
wherein depositing at least one aluminum nitride layer and depositing a second layer having the general formula $Al_yGa_{1-y}N$ are repeated to form the distributed Bragg reflector layer;
depositing a contact on an opposite side of the $Si_{1-x}Ge_x$ substrate from the side on which the distributed Bragg reflector layer is disposed;
wherein the structure is a vertical device; and
wherein the contact provides a conductive path for a current generated across at least one of the $Si_{1-x}Ge_x$ substrate and the distributed Bragg reflector layer.

* * * * *